(12) United States Patent
Dutta et al.

(10) Patent No.: US 7,972,885 B1
(45) Date of Patent: Jul. 5, 2011

(54) BROADBAND IMAGING DEVICE AND MANUFACTURING THEREOF

(75) Inventors: Achyut Kumar Dutta, Sunnyvale, CA (US); Robert Allen Olah, Sunnyvale, CA (US)

(73) Assignee: Banpil Photonics, Inc., Santa Clara, CA (US)

( * ) Notice: Subject to any disclaimer, the term of this patent is extended or adjusted under 35 U.S.C. 154(b) by 117 days.

(21) Appl. No.: 12/566,659

(22) Filed: Sep. 24, 2009

Related U.S. Application Data

(60) Provisional application No. 61/099,910, filed on Sep. 25, 2008.

(51) Int. Cl.
*H01L 21/00* (2006.01)

(52) U.S. Cl. .............. 438/48; 438/60; 438/75; 438/199; 438/788; 257/E21.007; 257/E21.085; 257/E21.126; 257/E21.127; 257/E21.189; 257/E21.229; 257/E21.24; 257/E21.264; 257/E21.304; 257/E21.352; 257/E21.617

(58) Field of Classification Search .................... 438/48, 438/57, 60, 70, 75, 197, 792, 199, 706, 745, 438/781, 788, 776; 257/E21.007, 85, 126, 257/127, 617, 189, 229, 245, 264, 304, 352
See application file for complete search history.

(56) References Cited

U.S. PATENT DOCUMENTS

| | | | | |
|---|---|---|---|---|
| 6,870,207 | B2* | 3/2005 | Taylor | 257/217 |
| 7,012,328 | B2* | 3/2006 | Costello et al. | 257/687 |
| 7,432,539 | B2* | 10/2008 | Taylor | 257/197 |

* cited by examiner

*Primary Examiner* — David Nhu

(57) ABSTRACT

This invention relates to imaging device and its related transferring technologies to independent substrate able to attain significant broadband capability covering the wavelengths from ultra-violet (UV) to long-Infrared. More particularly, this invention is related to the broadband image sensor (along with its manufacturing technologies), which can detect the light wavelengths ranges from as low as UV to the wavelengths as high as 20 μm covering the most of the wavelengths using of the single monolithic image sensor on the single wafer. This invention is also related to the integrated circuit and the bonding technologies of the image sensor to standard integrated circuit for multicolor imaging, sensing, and advanced communication. Our innovative approach utilizes surface structure having more than micro-nano-scaled 3-dimensional (3-D) blocks which can provide broad spectral response. Utilizing multiple micro-nano scaled blocks help to increase the absorption spectra more than the material used as the absorption layer. In addition, utilizing the multiple nano-scaled 3-D blocks help to increase the absorption over the wavelength due to the multiple reflections and diffractions inside the 3-D structures. The absorption layers will be designed to achieve the required quantum efficiency and also required speed.

20 Claims, 18 Drawing Sheets

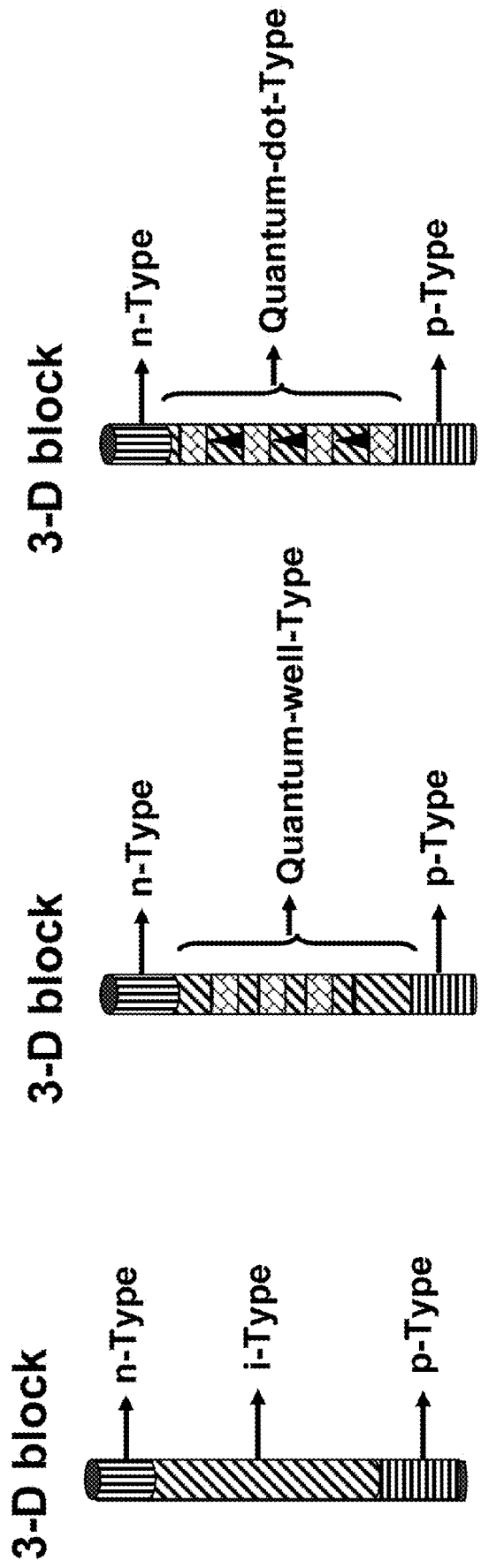

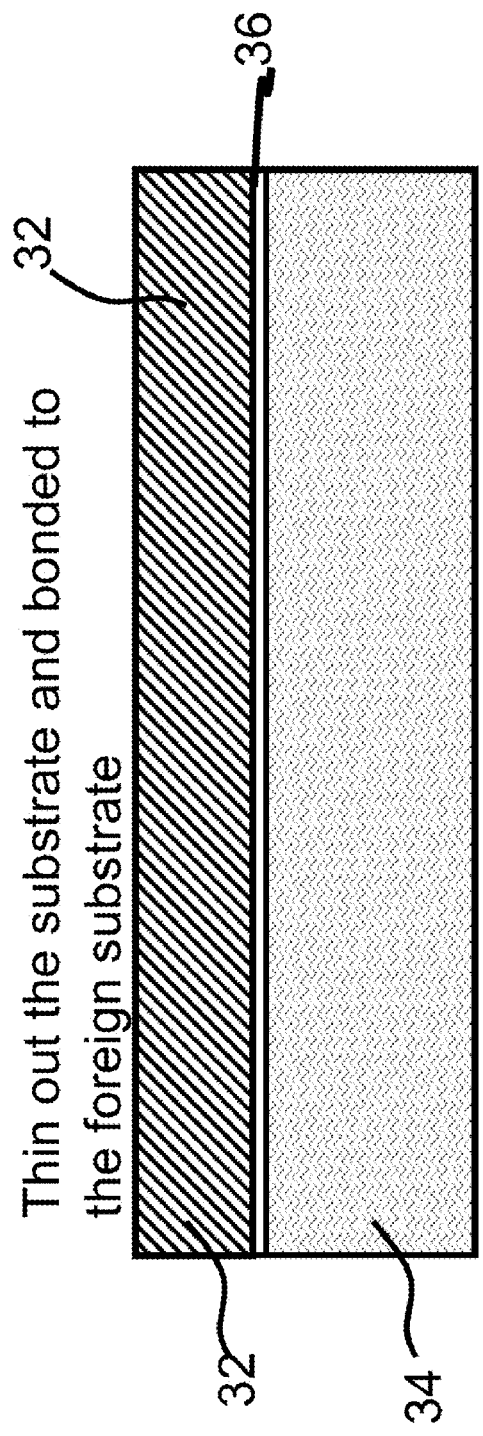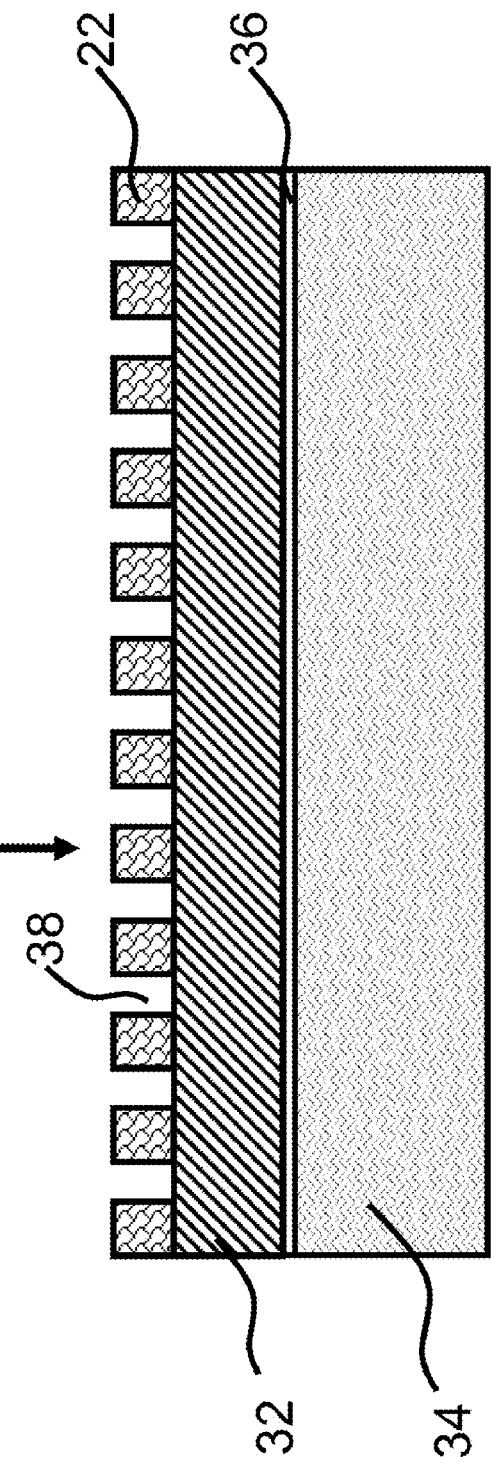

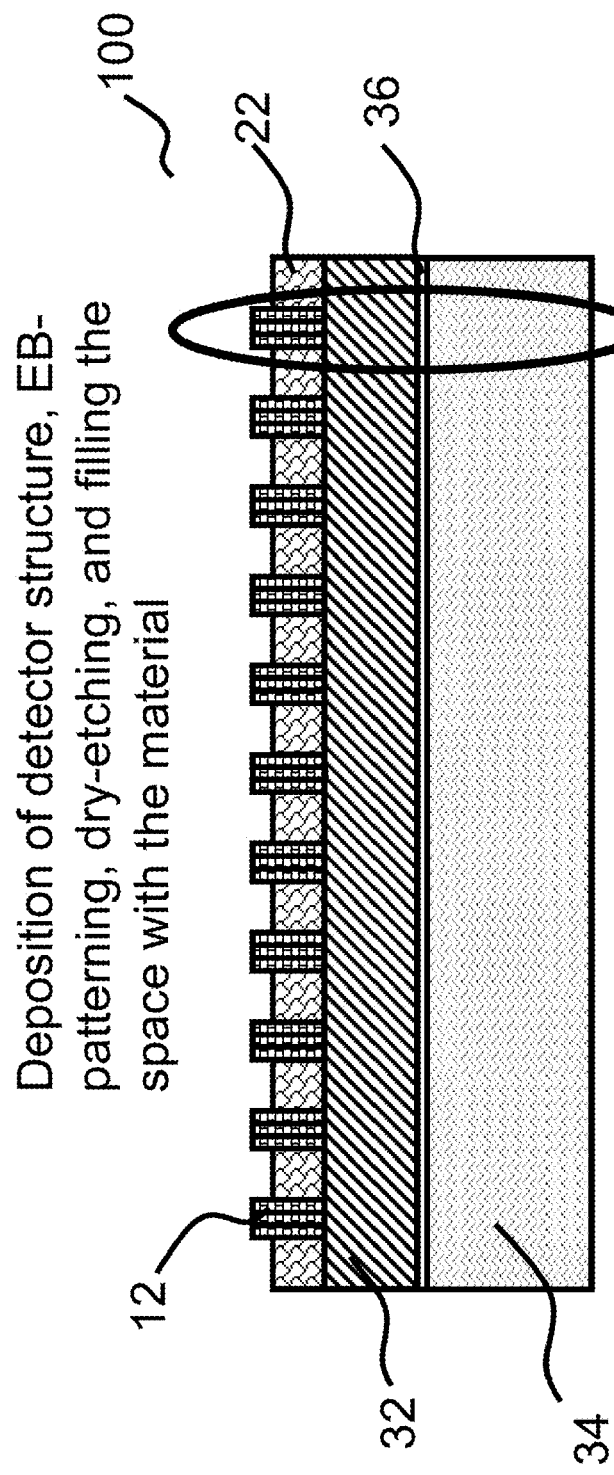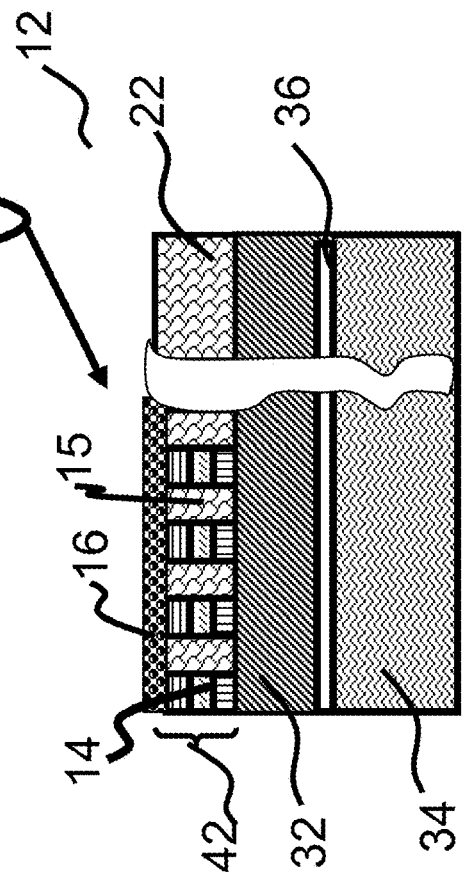
FIG. 5C
FIG. 5D

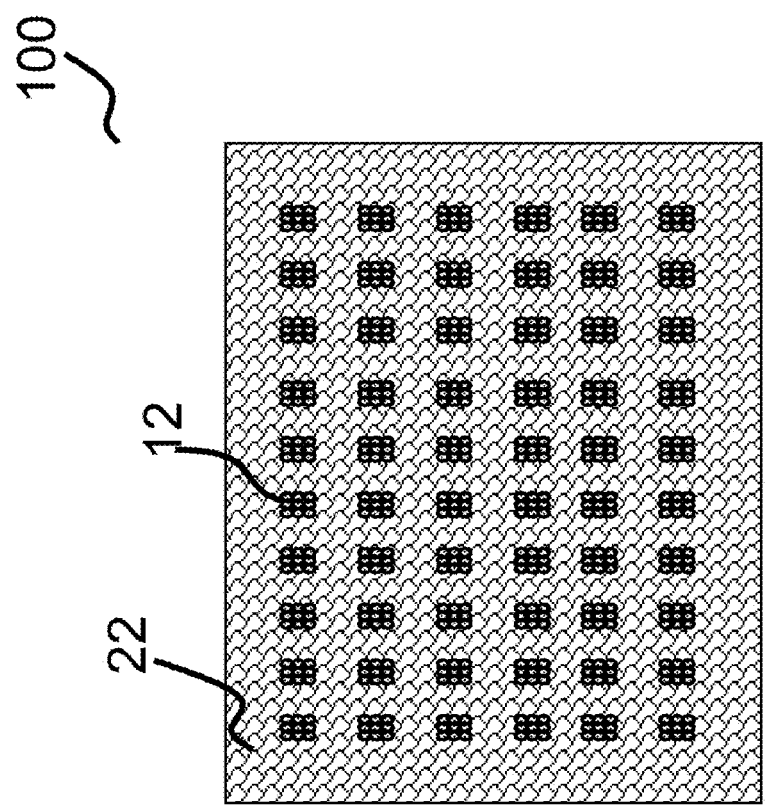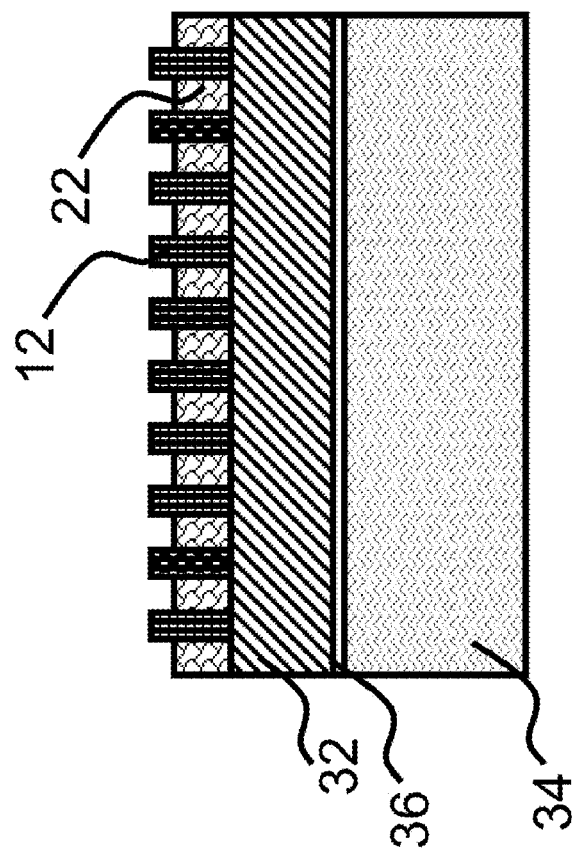
FIG. 8A
FIG. 8B
FIG. 8

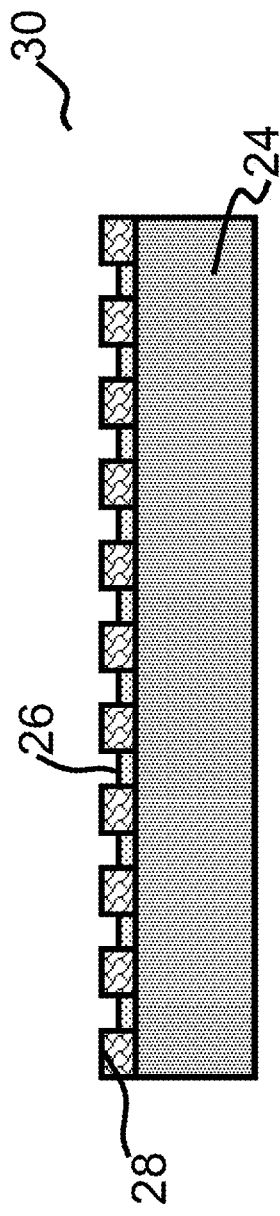
FIG. 9A
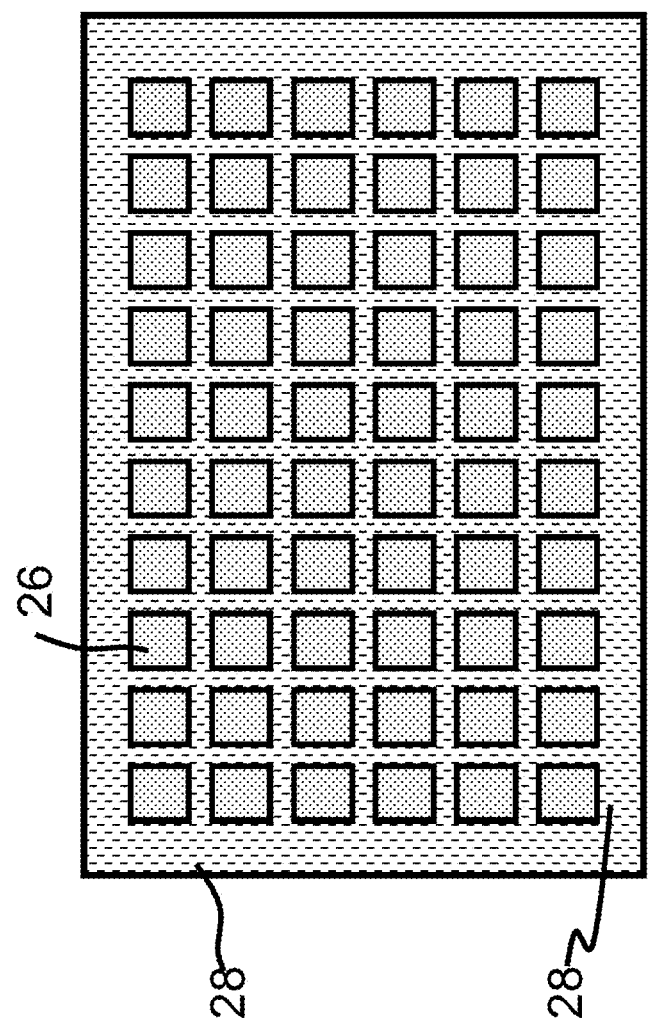
FIG. 9B
FIG. 9

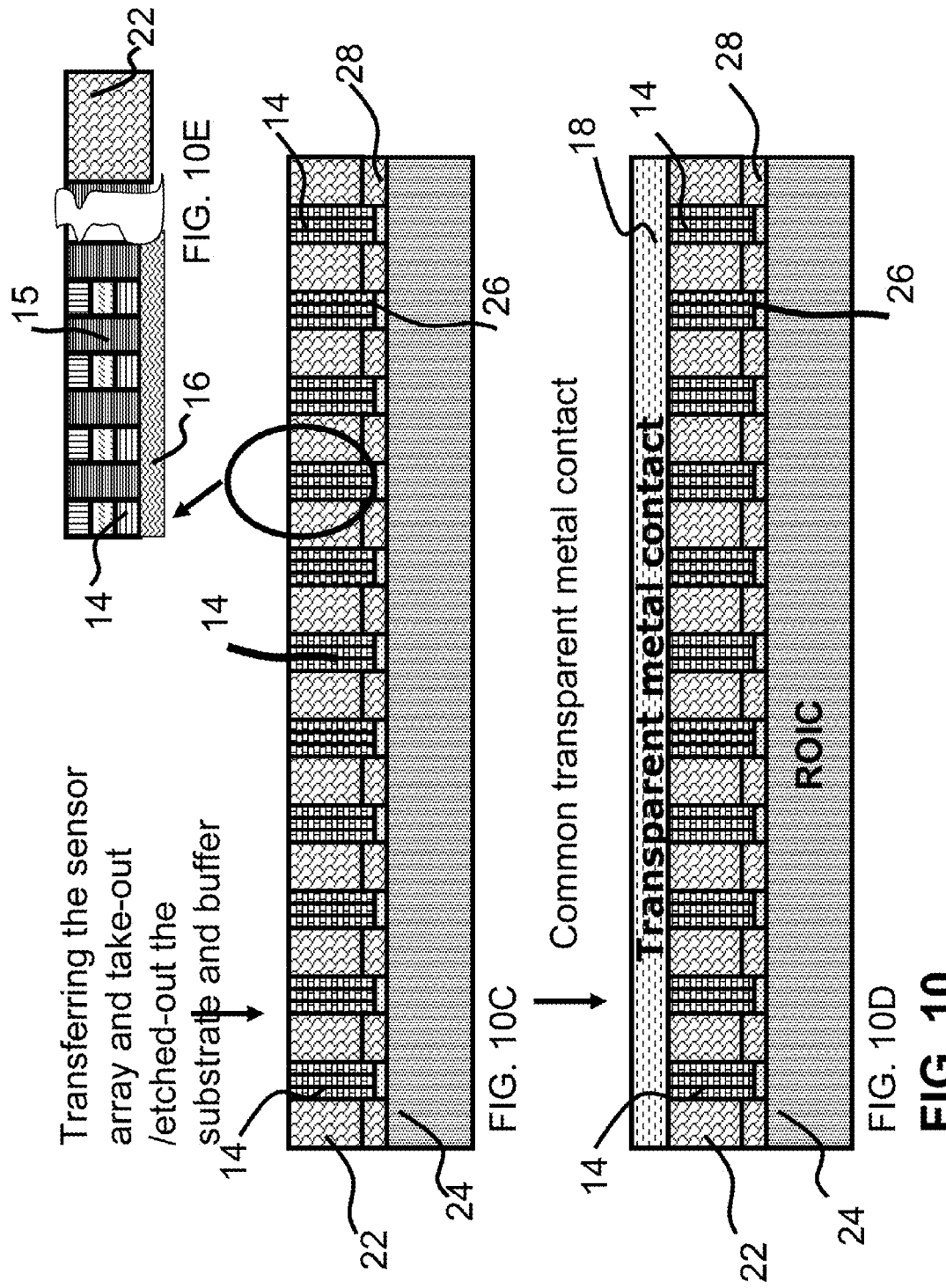

BROADBAND IMAGING DEVICE AND MANUFACTURING THEREOF

CROSS REFERENCE TO RELATED APPLICATIONS

This application claims the benefit of U.S. Provisional Application No. 61/099,910 filed on Sep. 25, 2008.

FIELD OF THE INVENTION

This invention relates to imaging device and its related transferring technologies to independent substrate able to attain significant broadband capability covering the wavelengths from ultra-violet (UV) to long-Infrared. More particularly, this invention is related to the broadband image sensor (along with its manufacturing technologies), which can detect the light wavelengths ranges from as low as UV to the wavelengths as high as 20 µm covering the most of the wavelengths using of the single monolithic image sensor on the single wafer. This invention is also related to the integrated circuit and the bonding technologies of the image sensor to standard integrated circuit for multicolor imaging, sensing, and advanced communication.

BACKGROUND OF THE INVENTION

Solid-state imaging devices with higher resolution are used in many commercial applications especially camera and also for other light imaging uses. Such imaging devices typically comprise of CCD (charge coupled device) photo detector arrays with associated switching elements, and address (scan) and read out (data) lines. This CCD technology is matured so much that now days millions of pixels and surrounding circuitry can be fabricated using the CMOS (complimentary metal oxide semiconductor) technology. As today's CCD technology is based on silicon (Si)-technology, the detectable spectral ranges of CCD are limited to the wavelengths below 1 µm where Si exhibits absorption. Besides, CCD based imaging technique has also other shortcomings such as high efficiency response combined with high quantum efficiency over broad spectral ranges. This broad spectral detection is required in many applications. One of them is the free space laser communication where shorter (in visible ranges) and near infrared wavelengths is expected to be used. Image sensor array having broad spectral detection capability, disclosed in this invention, is expected to provide those features not available in today's CCD and other imaging (e.g. InGaAs, HgCdTe, or PbS) technologies. With well design of the array, appreciable resolution can also be achieved in image sensor array technology.

Detectors (a.k.a. photodiode or sensor pixel) especially of p-i-n type have been studied extensively over the last decade for its application in optical communication. These photodiodes are for near infrared detection, especially the wavelength vicinity to 1310 and 1550 nm, where today's optical communication is dealt with. Today the photodetector speed as high as 40 Gb/s, as described in the publication by Dutta et. al. in IEEE Journal of Lightwave Technology, vol. 20, pp. 2229-2238 (2002) is achieved. Photodetector having a quantum efficiency as close to 1, as described in the publication by Emsley et. al., in the IEEE J. Selective Topics in Quantum Electronics, vol. 8(4), pp. 948-955 (2002), is also available for optical communication. These photodiodes use InGaAs material as absorption material, and the diode is fabricated on the InP wafer. On the other hand, Si substrate is used for the photodiode for detection of visible radiation. Other materials such as PbS, InAs, InSb, PtSi, PbS, and HgCdTe have been used for detectors for wavelengths greater than 1.65 µm but they generally have to be cooled to low temperature, often have very slow responses or have high dark current. Additionally, HgCdTe is plagued by material growth issues and narrow bandgaps also of InAs and InSb, result in detectors with large dark currents at room temperature.

None of current solution can provide broad spectral detection capability ranges from UV to long or mid infrared wavelengths, necessary to replace multiple sensors by one sensor. It is highly desirable to design the sensor having broader spectral detection ranges and can be fabricated on the single wafer.

For covering multiple spectral ranges, two photodiodes fabricated from Si and InP technology and discretely integrated, can be used. Monolithically, wafer bonding technology to bond Si and InP can be used to fabricated the photodiode covering the wavelengths from visible to near infrared. However, the reliability of wafer bonding over wide range of temperature is still an unsolved issue and a high-speed operation is not feasible with a wafer bonding approach. It is highly desirable to have a monolithic photodetector array (forming image sensor), which could offer high bandwidth (GHz and above) combined with high quantum efficiency over a broad spectral ranges (<300 nm to 3500 nm and also to <300 nm to 5500 nm). For using especially in imaging purpose where CCD or Si based image sensor based device are used, the multicolor photodiode array with the possibility to rapidly and randomly address any pixel is also very much essential.

It is our objective to develop a monolithic photodiode array for broad spectral ranges covering from UV to mid-infrared and extending to the long infrared wavelengths. It is also our intension to develop the image sensor fabrication to the same substrate by transferring the different material system on to the single substrate. Furthermore, it is also our objective to propose the bonding technologies as appropriate for the image sensor proposed and integrated circuit as the single device.

Our innovative approach utilizes surface incident type (either top- or bottom-illuminated type) photodiode structure having single absorption layer and consisting of more than micro-nano-scaled 3-dimensional (3-D) blocks which can provide broad spectral response. Utilizing multiple micro-nano scaled blocks help to increase the absorption spectra more than the material used as the absorption layer. In addition, utilizing the multiple nano-scaled 3-D blocks help to increase the absorption over the wavelength due to the multiple reflections and diffractions inside the 3-D structures. The absorption layers will be designed to achieve the required quantum efficiency and also required speed. The photodiode can be used as the single element and also in array form.

According to this invention, depending on the size and pitch of the 3-D blocks, percentage of light absorption over the wavelengths and also broadening the absorption spectra, the absorption spectra and absorption can be controlled.

According to the current invention, photodiodes having broad spectral ranges (<300 to 10,000 nm and beyond wavelengths), high quantum efficiency (>90%), and high frequency response, can be fabricated using a single wafer. According to this invention, in the case of photodiode array, each array can also be operated independently. The manufacturing thereof is also simpler as compared with the prior art. Some applications include multicolor imaging applications such as for astronomical observation, communication etc.

SUMMARY OF THE INVENTION

Accordingly, it is an object of the invention to provide the structures of image sensor, which could have broad spectral detections, ranging from UV to mid-infrared and also to long-infrared.

It is also an object that the structure of each element photodiode could provide high quantum efficiency over 90% and beyond over broad spectral detection ranges, and also high frequency response. The structure is easily fabricated using the standard image sensor fabrication process.

Another object of this invention is to provide the image sensor array structure, which would have the broad spectral detection ranges, and each of its sensor element (hereafter mentioned also as the pixel) could be operated independently. This image sensor array has the CCD or CMOS sensor like feature in addition to the broad spectral detection capabilities. This array of high pixel counts can be used for multicolor imaging device purpose.

It is also an object of the invention to provide the top (also mentioned as the 'front')-illuminated type and bottom (also mentioned as the 'back')-type detector, which uses the structures having broad spectral detection capability as mentioned previously.

Another object of the present invention is to provide the material types to be used for achieving broader spectral detection ranges for photodiode. These material systems are easy to deposit/growth using the standard IC technology and also transferring to the independent substrate (e.g. metal, polymer, semiconductor etc.).

Another object of the present invention is to provide the fabrication process to fabricate the image sensor array using the standard IC fabrication process.

According to the invention, the broadband image sensor having 2-D array, wherein each sensor pixel comprises, (i) a thinned substrate attached without or with carrier substrate wherein carrier substrate is attached by adhesive; (ii) an ohmic contact layer; (iii) more than one micro-nano-scaled 3-D blocks, spaced with specific pitch or randomly arranged, each of block comprises with p-i-n structure or p-n structure, (a) doped layer either complete buffer layer with the thinned substrate and/or a portion of substrate layer (b) intrinsic (i-type) layer is formed using i-type semiconductor (e.g. InGaAs, GaAs, SiGe, Si, HgCdTe etc.) for absorption layer, grown on the top of the first doped layer; (c) a thin layer of second doped or lightly doped layer of semiconductor on the top of absorption layer; (iv) each 3-D block is separated by certain pitch or randomly arranged, (v) the space between the 3-D blocks are filled or not filled by the insulator, (vi) a transparent layer of metal contact layer making the contact the top surface of the 3-d blocks, (vii) second metal contact, making ohmic contact on the bottom part of the 3-D blocks, top of the thick doped layer, or on the top of the substrate, wherein the light illuminated surface (opening area) could be the circular, rectangular or square shaped, and they are designed in a way that light can be illuminated either from the top surface or from the bottom surface (substrate side).

To avoid large resistance due to the abrupt junction formation, the gradual doping can be used in between intrinsic absorption layer and the second highly doped layer. A thin layer of spacer layer of type second layer can be used in between the second highly doped layer and intrinsic layer.

Alternatively, the top ohmic contact can be also replaced by a metal layer. Which could be used as the bonding purpose.

According to the invention, the broadband image sensor, comprising: 2-dimensional sensor array, (1) common thinned substrate, attached with or without carrier substrate to hold it, (2) 2-D array of the sensor pixel, arranged in x-y, wherein each sensor pixel comprises, (i) an ohmic contact layer; (ii) more than one micro-nano-scaled 3-D blocks, spaced with specific pitch or randomly arranged, each block comprised with p-i-n structure or p-n structure, (a) doped layer either complete buffer layer with thinned substrate and/or a portion of substrate layer (b) intrinsic (i-type) layer is formed using i-type semiconductor (e.g. InGaAs, GaAs, SiGe, Si, HgCdTe etc.) for absorption layer, grown on the top of the first doped layer; (c) a thin layer of second doped or lightly doped layer of semiconductor on the top of absorption layer; (iv) each 3-D block is separated by certain pitch or randomly arranged, (v) the space between the 3-D blocks is filled or not filled by the insulator, (vi) a layer of metal contact layer making the contact the top surface of the 3-d blocks for each pixel, wherein bottom-portion of the 3-D blocks is connected to common metal contact for all pixel after bonding to the integrated pixel, wherein top-metal contact separating each pixel is connected to the integrated circuit directly for independent addressing.

According to the invention, pixels having 3-D blocks, can be made from different material systems and transferred to the common substrate to interconnect to the IC.

According to the invention, the photodiode array comprises: (1) N×N array of photodiode elements, wherein each photodiode element (having broad spectral ranges of <300 nm to 3500 nm or more broader wavelength ranges), comprises, (i) an ohmic contact layer; (ii) a substrate; (iii) a first highly doped buffer layer, material-type same as the substrate; (iv) more than one micro-nano-scaled 3-D blocks, spaced with specific pitch or randomly arranged, each block comprises with p-i-n structure or p-n structure, (a) doped layer either complete buffer layer and/or a portion of substrate layer (b) single or plurality layers of $InAs_yP_{1-y}$ type material of different y, where y is <1 but >0; (c) intrinsic (i-type) or lightly doped layer of InGaAs for absorption layer, grown on the top of the singular or plurality layers of $InAs_yP_{1-y}$ type material; (d) a thin layer of second highly doped and/or lightly doped layer of InGaAs type as recessed layer or a thin layer of the etch stopper layer on the top of absorption layer; (v) each 3-D block is separated by certain pitch or randomly arranged, (vi) the space between the 3-D blocks is filled or not filled by the insulator, (vii) a transparent layer of metal contact layer making the contact to the top surface of the 3-d blocks, (viii) second metal contact, making common ohmic contact on the bottom part of the 3-D blocks, top of the thick doped layer, or on the top of the substrate, (2) interconnection metal line (transparent or not) connecting each photodiode to the outside pad, wherein each photodiode formed by more than one 3-D blocks, is independently addressable, and; wherein second metal contact acting as the common ohmic metal contact layer for all photodiodes in the array, To avoid large resistance due to the abrupt junction formation, the gradual doping can be used in between intrinsic absorption layer and the second highly doped layer. A thin spacer-layer of type second layer can be used in between the second highly doped layer and intrinsic layer.

Alternately, a graded layer can be incorporated in the structure to reduce the minority carrier trapping at the InAsP/InGaAs band edge discontinuity.

According to the invention, the photodiode array comprises: (1) N×N array of photodiode elements, wherein each photodiode element (having broad spectral ranges of <300 nm to 3500 nm or more broader wavelength ranges), comprises, (i) an ohmic contact layer; (ii) a substrate; (iii) a first highly doped buffer layer, material-type same as the substrate; (iv) more than one micro-nano-scaled 3-D blocks, spaced with specific pitch or randomly arranged, each block comprises with p-i-n structure or p-n structure, (a) doped layer either complete buffer layer and/or a portion of substrate layer (b) single or plurality layers of $InAs_yP_{1-y}$ type material of different y, where y is <1 but >0; (c) intrinsic (i-type) or lightly doped layer of InGaAs for absorption layer, grown on the top on the top of the singular or plurality layers of $InAs_yP_{1-y}$ type material; (d) a thin layer of second highly doped and/or lightly doped layer of InGaAs type as recessed layer or a thin layer of the etch stopper layer on the top of absorption layer; (v) each 3-D block is separated by certain pitch or randomly arranged, (vi) the space between the 3-D blocks is filled or not filled by the insulator, (vii) a transparent layer of metal contact layer making the contact to top surface of the 3-d blocks, (2) interconnection metal line (transparent or not) connecting each photodiode to the outside pad, and (3) second metal contact, making common ohmic contact made from the back-side of the substrate, wherein each photodiode formed by more than one 3-D blocks, is independently addressable, and; wherein second metal contact acting as the common ohmic metal contact layer for all photodiodes in the array, wherein bottom-portion of the 3-D blocks is connected to common metal contact for all pixel after bonding to the integrated pixel, wherein top-metal contact separating each pixel is connected to the integrated circuit directly for independently addressing.

It is also an object of this invention to provide the interconnection scheme where metal connection connecting each photodiode element to the outside pad and this can be designed in a way that metal contacts of the photodiodes located one-fourth of the array are designed to align in two sides. Replica of this metal layout can be copied for metal contact alignment for other photodiodes located in the three-fourth of the array.

According to the invention, the fabrication process of the photodetector comprises, (i) growing the layers forming the detector structure on the thinned substrate, either attached with or without carrier substrate; (ii) electron beam patterning, and subsequently dry etching for forming 3-D blocks up to the buffer layer or up to the substrate, (iii) etching the unwanted area, not necessary to have for the detector element; (iv) filling the spaces opened in between 3-D blocks by insulator, semiconductor, or the polymer material, (v) planarization of the active detector area; (vi) patterning and metallization to form the metal contact onto the 3-D blocks located in each active detector area; (vii) bonding/transferring each detector (by upside down) to the pad located onto the read-out circuitry which comprises; (a) read-out circuitry developed in silicon wafer; (b) silicon oxide grooves; and (c) metal pad in between grooves, connected to the ROIC to independently address each pixel; (viii) take out the carrier substrate; (ix) etched out the thinned substrate; (x) metallization to make the transparent metal contact for common contact for the detector array, and (x) formation of the antireflection (AR) coating on the top surface of the common metal contact.

According to the invention, the fabrication process of the photodetector comprises, (i) growing the layers forming the detector structure on the thinned substrate, either attached with or without carrier substrate; (ii) patterning and etching to open the area, wherein active detector is not located; (iii) deposition of the insulator (e.g. silicon oxide, or silicon nitride); (iv) electron beam patterning, and subsequently dry etching for forming 3-D blocks up to the buffer layer or up to the substrate; (v) filling the spaces opened in between 3-D blocks by insulator, semiconductor, or the polymer material, (vi) planarization of the active detector area; (vii) patterning and metallization to form the metal contact onto the 3-D blocks located in each active detector area; (viii) bonding/transferring each detector (by upside down) to the pad located onto the read-out circuitry which comprises; (a) read-out circuitry developed in silicon wafer; (b) silicon oxide grooves; and (c) metal pad in between grooves, connected to the ROIC to independently address each pixel; (ix) take out the carrier substrate; (x) etched out the thinned substrate; (xi) metallization to make the transparent metal contact for common contact for the detector array, and (xii) formation of the AR coating on the top surface of the common metal contact.

According to the invention, the fabrication process of the photodetector comprises, (i) deposition of the insulator (e.g. silicon oxide or silicon nitride); (ii) patterning and etching of the insulator to make the open space, wherein the active detector is located; (iii) growing the layers forming the detector structure on the thinned substrate, either attached with or without carrier substrate; (iv) planarization; (v) electron beam patterning, and subsequently dry etching for forming 3-D blocks up to the buffer layer or up to the substrate; (vi) filling the spaces opened in between 3-D blocks by insulator, semiconductor, or the polymer material, (vii) planarization of the active detector area; (viii) patterning and metallization to form the metal contact onto the 3-D blocks located to form each pixel active area; (ix) bonding/transferring each detector (by upside down) to the pad located onto the read-out circuitry which comprises; (a) read-out circuitry developed in silicon wafer; (b) silicon oxide grooves; and (c) metal pad in between grooves, connected to the ROIC to independently address each pixel; (x) take out the carrier substrate; (xi) etch out the thinned substrate; (xii) metallization to make the transparent metal contact for common contact for the detector array, and (xiii) formation of the AR coating on the top surface of the common metal contact.

According to this invention, it is also object to transfer the different sensor array on to the ROIC located on the common substrate. Utilizing different material system, detector array of different detection capability is possible. In this case, 3-D blocks made onto the separate substrate using different material system, are transferred to the ROIC by multiple transferring processes. In this case each alternative pad is occupied by the different material system 3-D blocks. The pads on ROIC are connected in such a way that separate spectral bands are connected for attaining each spectral band image and combining image considering broader spectrum, is also possible.

According to the invention, the fabrication process of the photodetector comprises, (i) growing the buffer layer appropriate for the detector on the matched or unmatched substrate; (ii) growing the layers forming the detector structure on the thinned substrate, either attached with or without carrier substrate; (iii) electron beam patterning, and subsequently dry etching for forming 3-D blocks up to the buffer layer or up to the substrate; (iv) filling the spaces opened in between 3-D blocks by insulator, semiconductor, or polymer material; (v) patterning and etching of the insulator to make the open space, wherein the active detector is located; (vi) deposition of the insulator (e.g. silicon oxide or silicon nitride); (vii) planarization of the active detector area; (viii) patterning and metallization to form the metal contact onto the 3-D blocks located to form each pixel active area; (ix) bonding/transferring each detector (by upside down) to the pad located onto the read-out circuitry which comprises; (a) read-out circuitry developed in silicon wafer; (b) silicon oxide grooves; and (c) metal pad in between grooves, connected to the ROIC to independently address each pixel; (x) take out the substrate/foreign substrate; (xi) etch out the thinned buffered layer; (xii) metallization to make the transparent metal contact for common contact for the detector array, and (xiii) formation of the AR coating on the top surface of the common metal contact.

According to this invention, the antireflection (AR) coating layer is to be compatible for the wavelength ranges to be detected to reduce the reflection loss. This AR coating could be the single layer or multiplayer combinations.

According to this invention, the p-i-n structure based 3-D block is mentioned. 3-D blocks of multiquantum well or quantum dots embedded 3-D blocks are also used.

According to this invention, the p-n structure based 3-D block is mentioned. 3-D blocks of multiquantum well or quantum dots embedded 3-D blocks are also used.

According to this invention, it is also an object to make the nano scaled 3-D blocks which are cylindrical, trapezoidal, conical, cubical, pyramid, or rectangular in shapes.

According to this invention it is an object to make the detector or sensor pixel which can be flip-chip bonding with the integrated circuit or transfer the structure sensor structure to the independent substrate.

According to this invention, it is an object to make the detector or sensor pixel not only made broadband, but also to absorb all light by trapping inside to increase the sensitivity and at the same time reduce the dark current.

According to this invention, in order to avoid large contact resistance while bonding to the ROIC, the z-axis polymer can be used to connect in bonding pixel with the pad. This acts not only as a cushion eliminating the stress during bonding, but also reduces the contact resistance due to the z-axis conducting path. According to this invention, the z-axis polymer also helps to bond the pixel and reduces the resistance and also isolating pixel to pixel, as it does not have any conduction in the x-y direction.

According to this invention, the interconnection of each photodiode element comprising with multiple nano-scaled blocks, connecting to the outside is done by flipping upside down the whole array structure and bonding each photodiode element to the metal pads located on the independent substrate. The light is incident from the backside of the etched substrate.

It is also an object to transfer the 3-D blocks to the third substrate to make the broadband image sensor made from the different material systems and operated on the common substrate after transferring.

It is an object of this invention to provide the bonding technique of the single detector and detector array on the carrier on which the logic circuit is bonded or monolithically fabricated.

According to this invention, the detector array previously described having the quartz or semiconductor for making easiness of etching of substrate, can also be bonded on the carrier having the logic circuit using the flip-chip bonding. The difference here is that the carrier is designed with groove to fit the quartz or semiconductor attached on the photodiode array. The high thermal conductive epoxy can be used in the space between the groove and quartz or semiconductor.

The invention offers to detect broad detection ranges varying from UV to mid infrared as high as long infrared wavelengths with high quantum efficiency, high frequency response, and increased signal-to-noise ratio. With proper design and fabrication process, M×N photodiode arrays can be fabricated with capability to independently addressable each photodiode. The photodiode array will have the CCD like feature with broad spectral detection capability. The signal processing circuit can also be integrated monolithically or hybrid. These inventions could be easily implementable as today's manufacturing technology can be used. The detector mentioned in this invention will be used for multiple purpose optical detection for many applications.

Another advantage of this invention is that conventional material and IC fabrication technology can be usable to fabricate this photodiode and its array.

Other objects, features, and advantages of the present invention will be apparent from the accompanying drawings and from the detailed description that follows below.

BRIEF DESCRIPTION OF THE DRAWINGS

The invention will be explained in more detail in conjunction with the appended drawings wherein:

FIGS. 3A, 3B and 3C are the schematics showing the cross-sectional view of each 3-D block structure, according to this invention.

FIGS. 5A to 5D are the schematics showing the cross-sectional view of fabrication process flow of the broadband sensor array in accordance to the present invention;

FIG. 8A is the schematic showing the cross-sectional view of image sensor array, prior to the transferring, and FIG. 8B is the schematic showing the top view of the FIG. 8A, in accordance to the present invention;

FIG. 9A is the schematic showing the cross-sectional view of the ROIC prior to the transferring, and FIG. 9B is the schematic showing the top view of the FIG. 9A, in accordance to the present invention;

FIGS. 10A to 10E are the schematic showing the enlarged cross-sectional view of the bonding process of the sensor array with the ROIC, in accordance to this invention.

DESCRIPTION OF THE PREFERRED EMBODIMENTS

Figure 1:
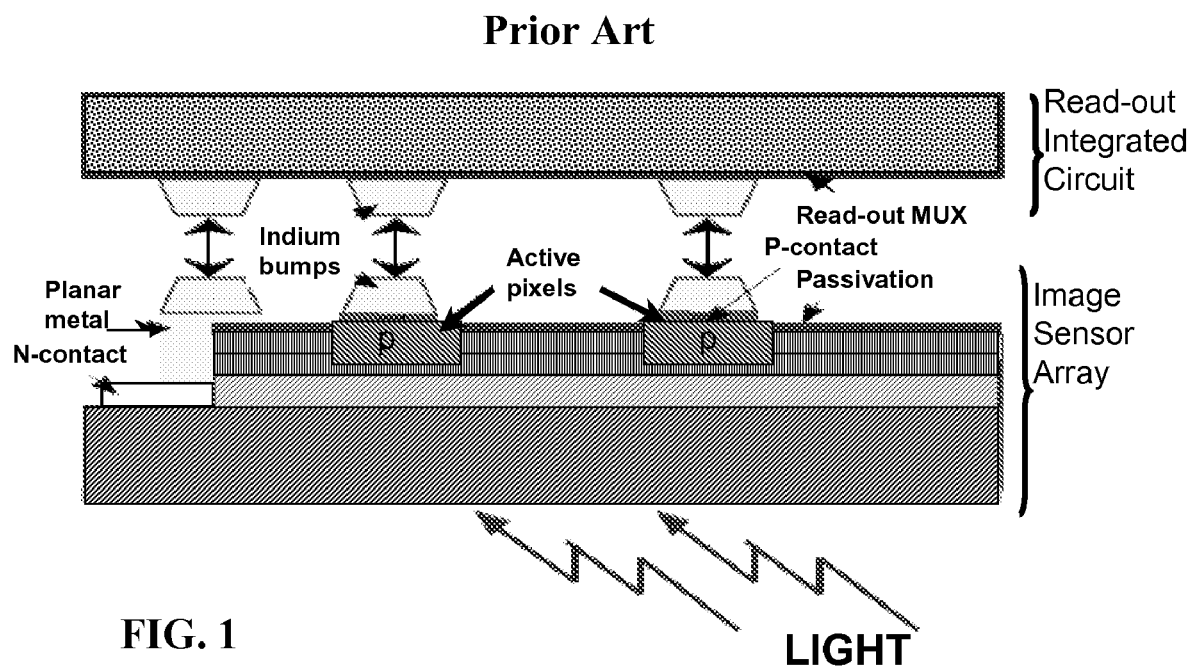
FIG. 1 is the schematics showing the cross-sectional views of detector arrays bonded with the read-out integrated circuit (ROIC). These are the explanatory diagrams showing the prior-art of today's photodetector element.

The best modes for carrying out the present invention will be described in terms with reference to the accompanying drawings. In the following description, the same reference numerals denote components having substantially the same functions and arrangements, and duplicate explanation will be made only where necessary.

Here the structure and design we mention, are for both top (also mentioned as 'front')-illuminated and bottom (also mentioned as 'back')-illuminated type image sensor and their array having broad spectral detection ranges. The main objective of this invention is to make the broad spectral array from any material systems such as Si, Ge, SiGe, GaN, GaAs, InP, InGaAs, InAs, HgCdTe, CdTe, ZnCdTe, PbS etc. This covers all sensor and its array with broad spectral detection ranges which covers from <300 nm (or as low as UV to long-Infrared (10 μm and more longer) wavelengths range. This invention also cover the sensors and their array's transferring technology to the independent substrate, bonding technology, and also covering their broadband optics system and their configuration, necessary for the broadband camera system. For easiness in discussion, we explain each component in section and later their combination to make the broadband camera systems.

Today's image sensor system made from any material systems (e.g. Si, Ge, Si:Ge, InP, GaAs, InSb etc.) comprising with image sensor array, read-out integrated circuit (ROIC), and optics systems which makes image transfer to electronics and their signal processing.

Image sensor array (a.k.a. detector array) made from any material systems are mainly made from p-n or p-i-n structure and their junction is made from the bulk semiconductor material systems and they are made specifically for the specific spectral band. For example, (i) Si based p-i-n image sensor cover spectral band only in the visible ranges covering from 400 nm to 780 nm, (ii) image sensor made from GaAs cover only 400 to 850 nm, (iii) InP based image sensor cover only 980 nm to 1700 nm, (iv) InSb based image sensor covers only 3.0 to 5.0 μm, and (v) HgCdTe based image sensor cover 1.0 to 10 μm. It is clear that so far there are no image sensor which cover as low as near UV or UV to as high as long-infrared (Long-IR). For detecting all spectrum band, it is necessary to incorporate all image sensors made from different material systems. As they are separate image sensor devices, it not only makes the system bulky, but also increases its power budget. Furthermore, each image sensor is made from the p-n junction of bulk material, this causes a reduction in the sensitivity, as signal to noise ratio gets reduced. It is highly desirable to develop the image sensor system covering from UV to long-IR incorporating necessary broadband image sensor devices, ROIC, and their optics.

As an example of image sensor device, which is made from standard material systems, such as Indium phosphide (InP), its detector (single pixel image sensor) especially of p-i-n type has been studied extensively over the last decade for its application in optical communication. These detectors are based on the structure and material system, which can detect the wavelengths covering from 1000 nm to 1600 nm. They are mostly comprised with a thin layer of InGaAs acting as the absorption region, is sandwiched between two layers of doped InP, forming bulk p-i-n structure. These two materials (InGaAs and InP) combination used in the photodiode determine mainly photodiode's spectral detection region. In addition, the dark-current (a.k.a noise) is mainly dependent on the material type and growth and usually with increasing of the area of the diode, the dark-current (signal-to-noise ratio) increases at the fixed bias voltage. Details of the prior art photodiode can be found in the chapter written by K. Taguchi, in the book, entitled "WDM Technologies: Active Optical Components" (Editor: A. K Dutta), published by Academic Press, Boston, Mass. Fabricating each sensor pixel in array and capable to operate them independently make the image sensor device which is usually bonded with the ROIC, where each pixel is bonded to the pad of ROIC with the help of Indium bump, as shown in FIG. 1. Light is generally illuminated from the back side of the image sensor and front side is usually bonded with the ROIC. Each pixel of image sensor is made from p-n junction and as mentioned earlier, they are bulk semiconductor junction. For having sufficient absorption, thicker absorption layer is usually used. Greater thickness increases defects, dark currents, capacitance, and cooling requirement. In addition, especially, longer wavelength image sensor (mid and long-infrared wavelengths) such as HgCdTe or InSb based image sensor, require to use the fixed substrate which increases the cost of these type of image sensor.

Furthermore, for capturing certain wavelengths of light, it is required to keep pixel-size wider in some extent, beyond lowering that, sensitivity for certain wavelengths (especially longer wavelength) can not able to detect. For capturing longer wavelengths, especially to detect the longer wavelength (short-wave infrared and longer), sensor pixel size needs to larger. For example, for capturing the mid-IR and/or longer wavelengths, more than 20 μm×20 μm pixel size is necessary. With increasing of the pixel size, the signal to noise ratio increases and appreciable quality is difficult to achieve if cooling is not incorporated in longer wavelength systems. In addition, for making the multi-spectral imaging system, several imaging devices along with their integrated ROICs need to be used. To alleviate all of these problems cited above, it is highly desirable to develop the broadband image sensor system incorporated with broadband image sensor devices, monolithically fabricated and/or transferred to the independent substrate after or before bonding with single ROIC to operate the whole spectral range information, single ROIC, and broadband optics.

Utilizing InGaAs image sensor on InP substrate, it is possible to extend the spectral ranges near UV to 1700 nm with modification of the InGaAs contents, the spectral ranges can be extended close to 2500 nm. The development work of the diode is described in the paper published in SPIE conference proceeding 6014, paper 60140C-1, 2005 by Achyut Dutta et. al. However, in this case the spectral detection range is only limited in between 300 nm to 1700 nm which is near UV (or UV) to shortwave-infrared (SW-IR). It is highly desirable to have diode spectral range extending from UV to Mid-Infrared (Mid-IR) and further to long-IR.

In the prior art (not shown here), a wafer bonding technique (not shown) is also usually used to design a photodetector with wide spectral response. In such devices, longer wavelengths are absorbed by a device bonded below, while shorter wavelengths are detected by a Silicon photodiode, wafer bonded to an InP based structure. As the linear thermal expansion coefficient (TEC) of InP and Si are $4.60 \times 10^{-6}$ $C^{-1}$, and $2.6 \times 10^{-6} C^{-1}$, respectively, the TEC mismatches cause stress in a wafer-bonded structure in wide temperature range operation. In addition, making an array with a wafer bonded structure poses a great challenge in designing interconnect with the aim of addressing individual pixels.

Figure 2A:
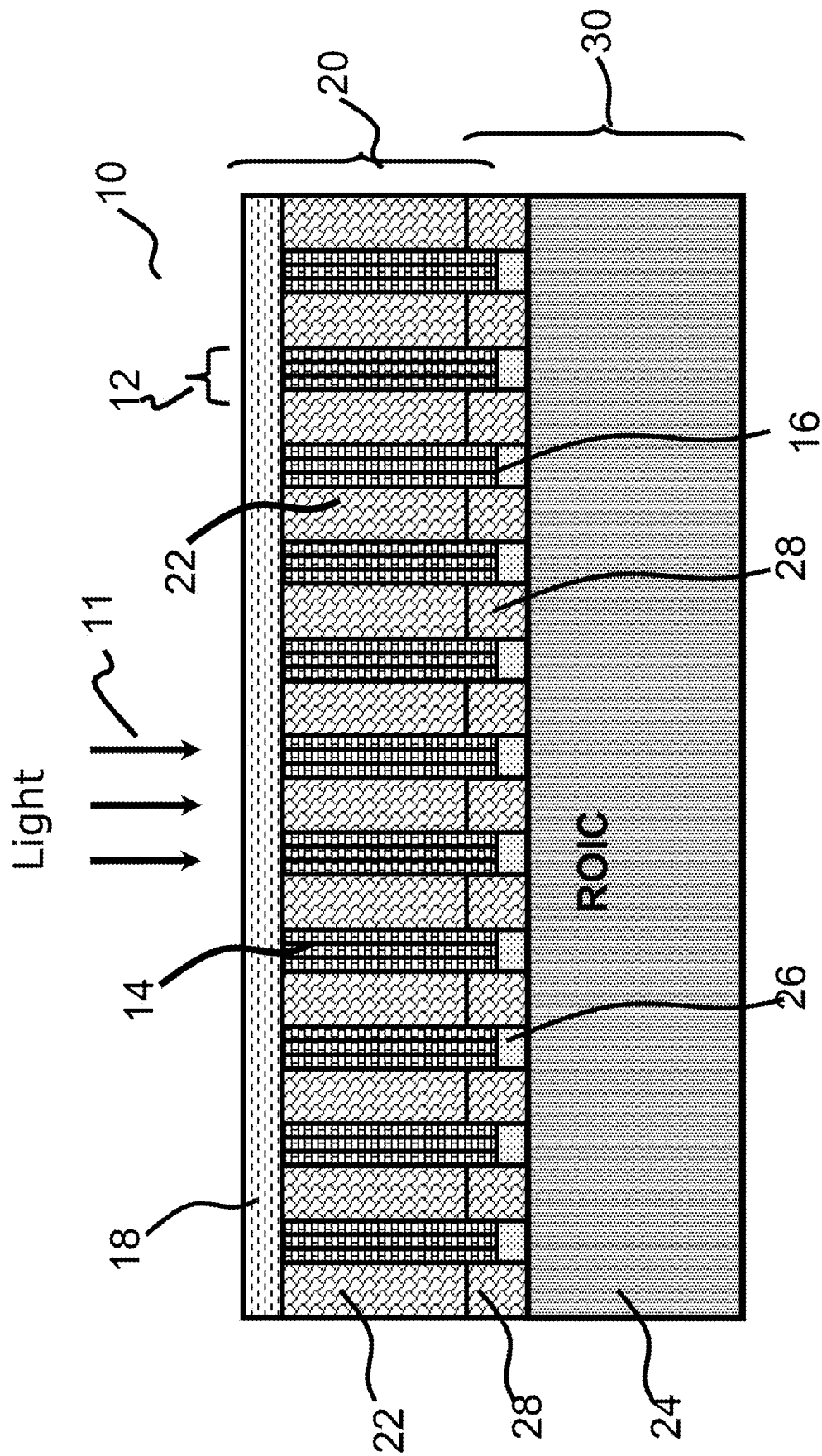
FIG. 2A is the schematic showing the cross-sectional view of the sensor array with the ROIC.
Figure 2B:
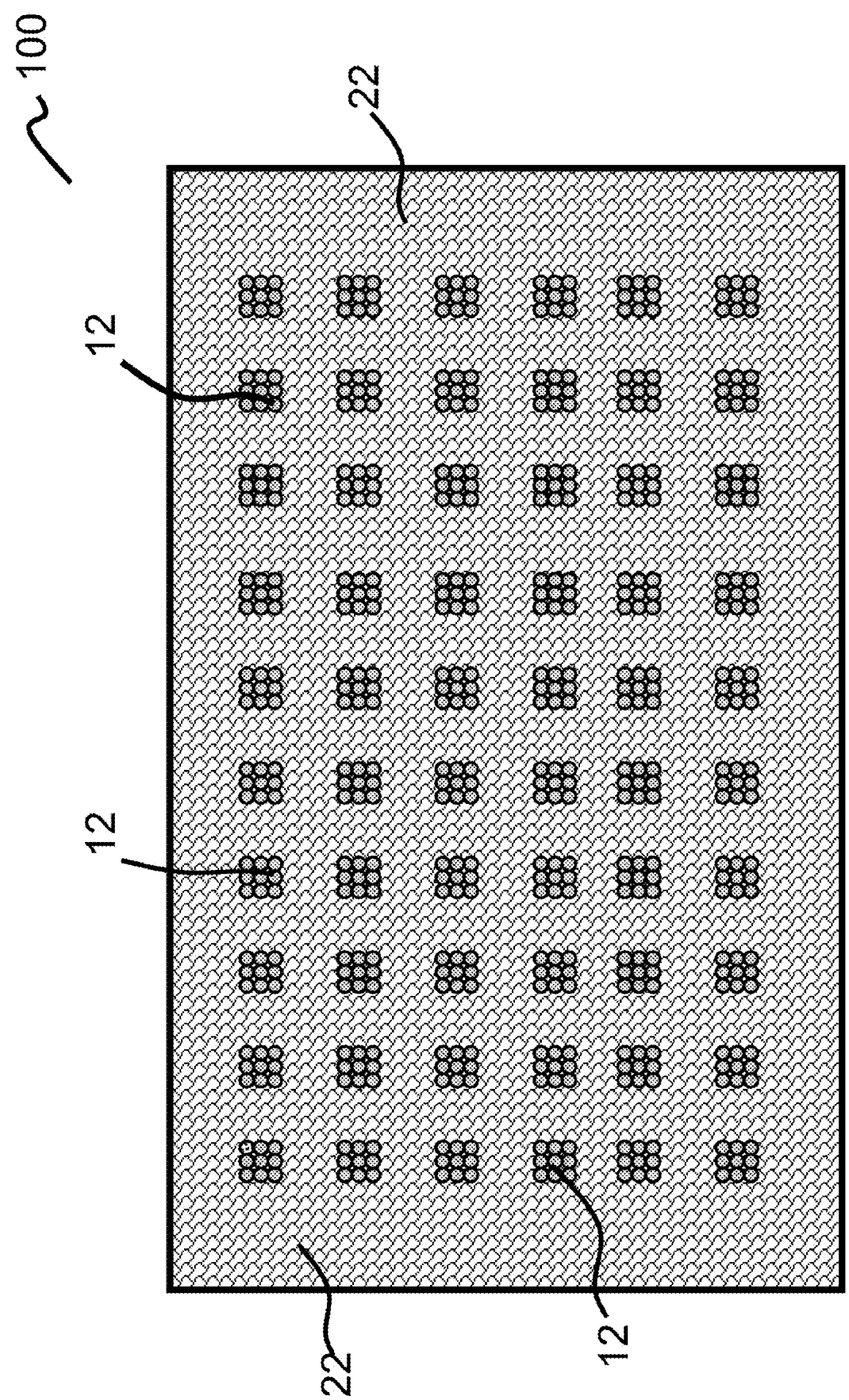
FIGS. 2B and 2C show the top view of the sensor array prior to up-side down bonding, and enlarge view of the each sensor pixel before transferring to the ROIC.
Figure 2C:
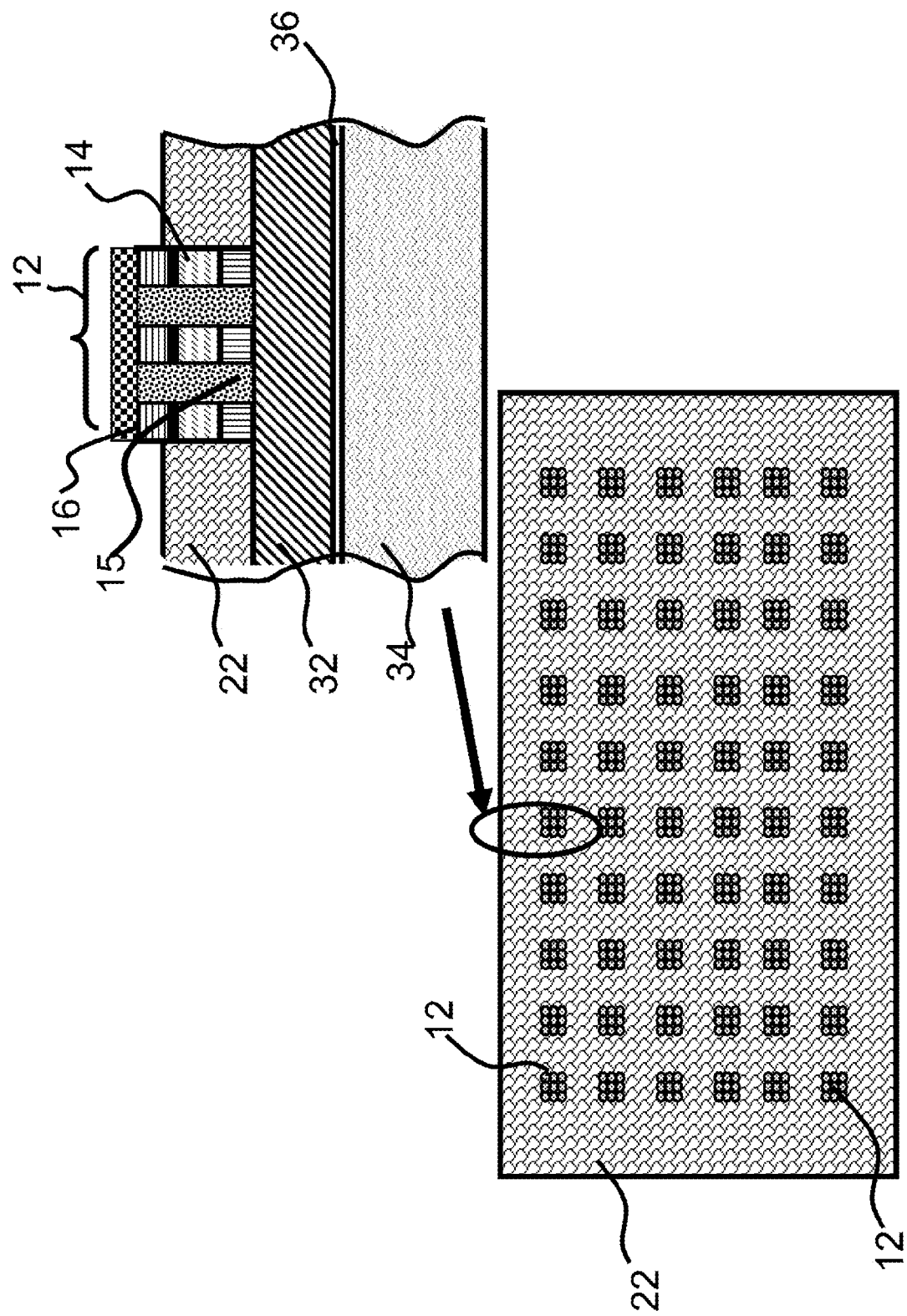

According to this invention, example of the broadband image sensor along with its ROIC after bonding is shown in FIG. 2A. Imaging system 10 without optics comprises with array of the sensor pixel (diode) 20, integrated with the ROIC 30. FIGS. 2B and 2C are the schematics showing the top views of the sensor array (before transferring to the ROIC 30) and enlarged view of the each sensor pixel (detector element), respectively, in accordance to this invention. Each sensor pixel 12 further comprises with multiple nano-scaled 3-D blocks 14, receiving all wavelength of the light 11 and absorbing the light with higher wavelengths capability than its macro-bulk material, spacer 15 in between two 3-D blocks, metal contact 16, and common metal contact 18. Utilizing the nano-scaled 3-D blocks, it is possible to make the detector broader absorption spectrum and its broadness are dependent on the diameter, and space of the nano-scaled blocks 12. For example, if the InGaAs (lattice matched to InP) 3-D blocks 14 of diameter 100 nm or so is used as an absorption layer (not shown here), and an ohmic contact layers which do not absorb significant number of photons, the absorption spectra can be extended from 1700 or 2500 nm to Mid-IR. Bulk (macro) InGaAs layer has the absorption edge in the vicinity of 1700 nm and with changing the contents, absorption spectra can be extended to 2500 nm, beyond that it is not possible if the bulk InGaAs is used as the absorption layer.

Figure 2D:
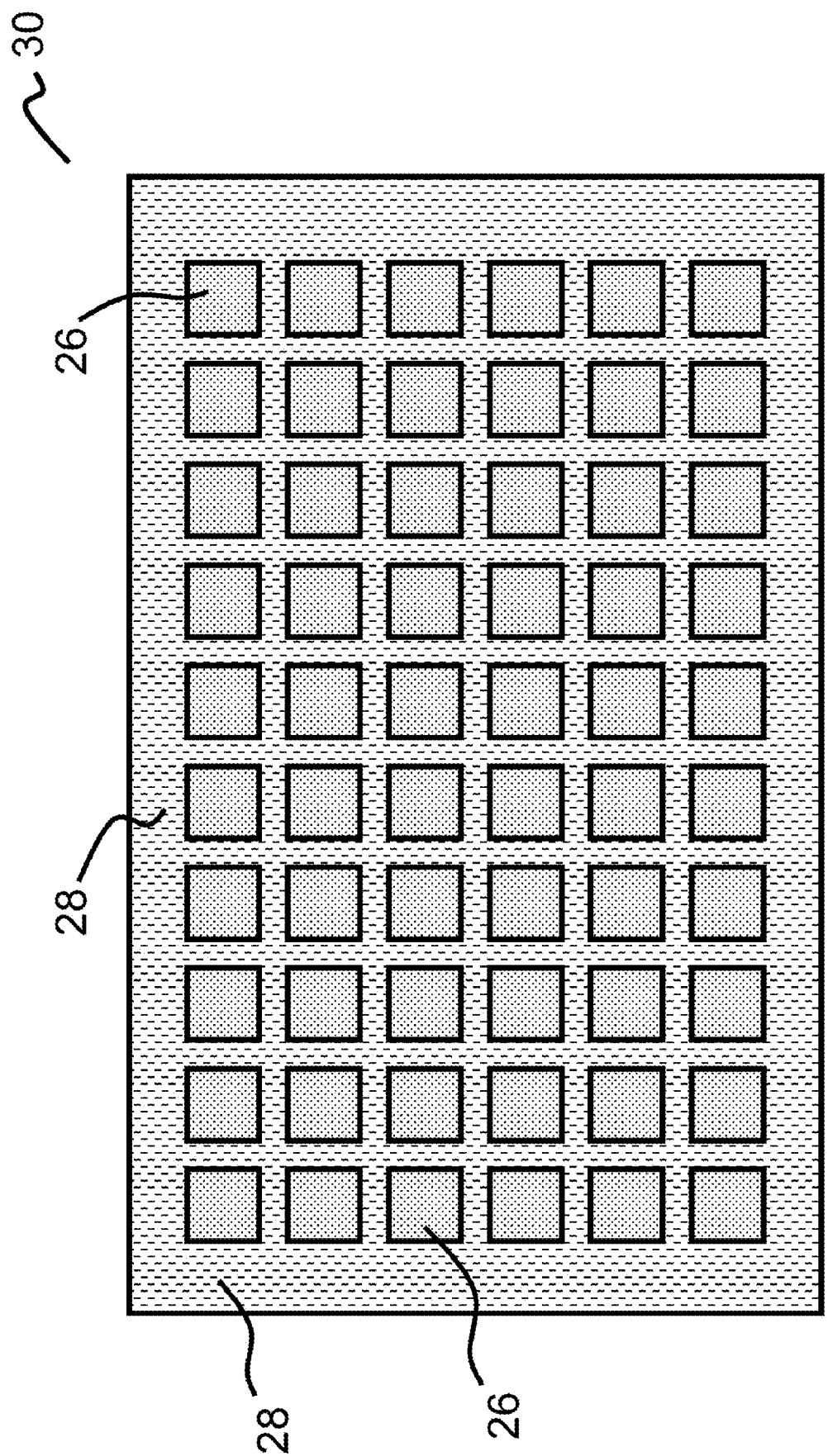
FIG. 2D shows the top view of the ROIC before detector array, according to this invention.

Each sensor array comprises with the detector elements 12 and separated by the space, filled up with the insulator 22, such as polymer, silicon oxide, or silicon nitride etc. The sensor arrays are bonded to the ROIC 30, which comprises with substrate 24, integrated circuit (not shown here) made on the substrate 24, metal pads 26, internally connected to the integrated circuit (not shown here) for signal processing, and separator filled with insulator 28. FIG. 2D is the schematic showing the top views of the ROIC in accordance to this invention so that repeated explanation is omitted here. Each detector pixel 12 is bonded to the each pad. Indium bumps (not shown here) can be used for bonding.

Sensor array 20 is fabricated onto the separate substrate or thinned substrate/layer 32 bonded with the glass or other carrier substrate 34 by adhesive 36. Sensor array fabricated from any material system is transferred to the ROIC 24. Sensor array 20 is fabricated on the substrate, lattice matched for the detector material system, and transferred to the ROIC 24. After bonding, the substrates 32 (and 43) are taken out or etched out. Top metal contact 18 acting as the common electrode in the sensor array 20 is formed after transferring.

Furthermore, each 3-D block 14, as shown in FIGS. 3A to 3C, comprises with p-i-n structure or p-n structure which are bulk material, multi-quantum well structure, or quantum dot embedded type structure. Based on the number of the 3-D blocks, their diameters, and spaces, comprising each detector element 12, determine the spectral broadening, and its detector sensitivity. For example with optimized design InGaAs based material system based detector's spectral response can be extended from UV to 3500 nm and also from UV to 5000 nm.

Figure 4:
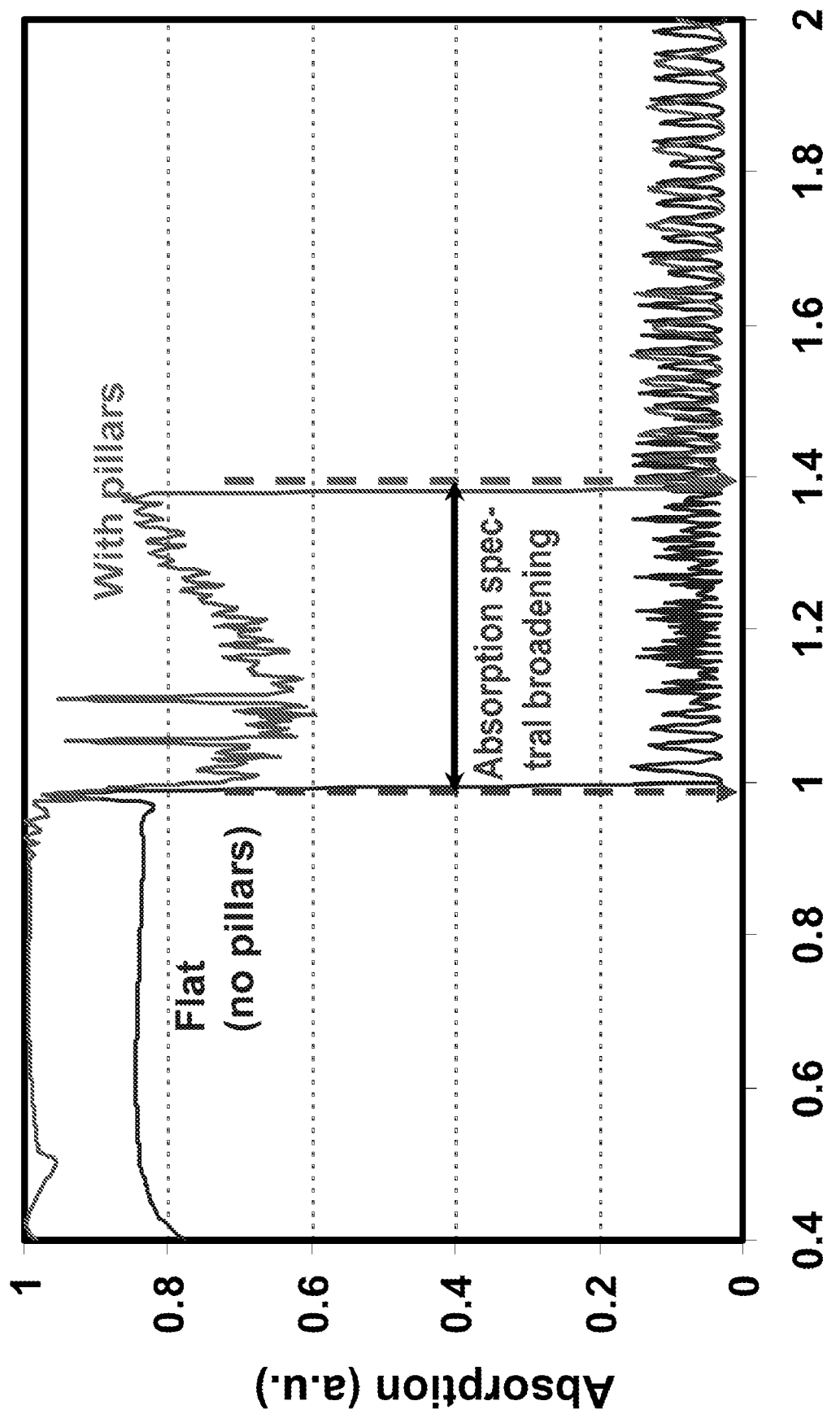
FIG. 4 shows the results of the 3-D blocks optical performance in according to this invention.

FIG. 4 shows the simulation results of the detector comprising with 3-D blocks according to the invention. The detector comprise with n-number of 3-D blocks of 0.1 μm diameter and arranged in array having 0.1 μm space in between the 3-D blocks. Each 3-D block consists of the p-i-n structure having InP absorption layer. Light from UV to 1.5 μm is illuminated on the 3-D blocks. It is known that InP has the sharp edge at the wavelength vicinity to 0.9 μm. It is seen in FIG. 4 that the spectral absorption range has been extended from 0.9 to close to 1.4 μm. This is possible using of the 3-D blocks which helps to extend the absorption spectra. Further broadening of the wavelength more than 2 μm is also expected if the pillar (3-D blocks) diameter is below 0.1 μm. In addition, the absorption at lower wavelength is also seen to be increased due to the minimizing the reflection, as compared with the flat surface.

According to this invention, the detector having the nano-scaled 3-D blocks and fabricated using any material systems such as Si, Ge, SiGe, InP, GaAs, GaN, InGaAs, HgCdTe, or PbS, the wavelength can be tremendously extended and increase the quantum efficiency, speed, and also sensitivity of the detector.

For the purpose of an example but not for the limitation, each sensor pixel can be also made from the micro-nano scaled 3-D blocks and junction can also be made from all over the surface to collect the carrier. Also alternatively, the junction can be made vertically in the 3-D blocks.

FIGS. 5A to 5D are the schematics showing the fabrication process of the sensor array in accordance to the present invention wherein the same parts are represented by the same numerals so that repeated explanation is omitted here. This fabrication process described here is only for an example, not for limiting the invention. Every material system can be used for making the detector element utilizing other material system. Thin substrate or transferred semiconductor layer 32 is used, and it is attached with the foreign substrate 34 using the adhesive 36. Thicker substrate can be also used without attaching with the foreign substrate. The silicon oxide or insulator is deposited and it is patterned and dry-etched to make the pillars 22 of high aspect ratio and the space 38 in between the pillars. Patterning can be made utilizing either Electron-beam patterning or nano-imprinting utilizing the master mold. Dry etching technique is used to make high aspect ratio grooves with opening 38. Standard resist or any mask material can be used in dry etching process. Detector structure 42 having p-i-n junction or p-n junction is selectively grown into the space 38. Electron-Beam (EB) patterning and dry-etching are done for making the multiple 3-D blocks in opening 38. The spaces between two 3-D blocks are filled up by the insulator or polymer 15. After planarization, metal contact 16 connecting multiple 3-D blocks and also forming individual pixel 12 in the sensor array are formed. After this process, the sensor array 100 with the thinned substrate or layer 32 bonded with the carrier substrate 34 is ready to bond with the ROIC 30.

Alternatively, gold nano-particle (not shown here) is placed in the space 38, acting as the catalyst, and crystal nano-pillars are grown in the space 38. p-i-n structure can be created while nano-pillars are grown. Alternatively, single type (e.g. n-type doped) semiconductor is grown in the space 38, and opposite type (p-type doped layer) semiconductor layer is formed all over the surface to make the p-n junction. Other process is similar as explained in earlier. Alternatively, instead of growing opposite type semiconductor layer, dopant can be diffused to make the opposite semiconductor type for p-n junction.

FIGS. 6A to 6E are the schematics showing alternative fabrication process of the sensor device in accordance to the present invention wherein the same parts are represented by the same numerals so that repeated explanation is omitted here. This fabrication process described here is only for an example, not for the limitation. Every material system can be used for making the detector element utilizing other material system. For simplicity InP based material system is cited here. However, this covers also other material systems such as GaN, Si, SiGe, GaAs, InP, InAs, HgCdTe, PbS, etc. Thin substrate or transferred semiconductor layer 32 is used, and it is attached with the foreign substrate 34 using the adhesive 36. Thicker substrate can be also used without attaching with the foreign substrate. For making the detector structure 42, the required buffer InP layer, absorption layer InGaAs, and high doped InGaAs layer (not shown here) are deposited on the substrate 32 using standard deposition techniques such as metal-organic chemical vapor deposition, or molecular beam epitaxial technique etc. Note here that, required spacer layer (not shown either) avoiding the doping diffusion into the absorption layer may be required. Patterning and subsequent dry etching would make the micro-nano-scaled 3-D blocks 14, and space 44. Patterning can be made utilizing either EB patterning technique or nano-imprinting utilizing the master mold. Dry etching technique is used to make the 3-D blocks 14. Standard resist or any mask material can be used in dry etching process. This is followed by filling the space by insulator or semiconductor material of opposite type. Standard polymer (or monomer) material having less or no absorption of wavelengths of interest can be used. Silicon oxide or silicon nitride utilizing the chemical vapor deposition can also be used as the filler material. Sol-gel silicon oxide can also be used alternatively. Metallization for making the contacts 16 forming individual pixel 12 are made.

Alternatively, wet-etching (not shown here) is done to open the contact area for the bottom contact. After depositing the filler (spacer) material 15, thickness same or less than the height of the 3-D blocks 14, patterning and wet-etching is done to open the contact area and subsequently metallization to make the metal contact 16 for connecting the multiple 3-D blocks 14 forming each pixel 12. Other process is the same as mentioned earlier.

Alternatively, according to this invention thinner substrate 32 (not shown in process flow) is used to fabricate the detector element. Substrate is thinned out using thin-cut process. Other process such as the laser cutting or polishing technique can be used for this purpose. Both laser cutting and thin-cut process help to utilize the remainder of the substrate for other detector element and reduce the manufacturing cost of the proposed detector.

Figure 6:
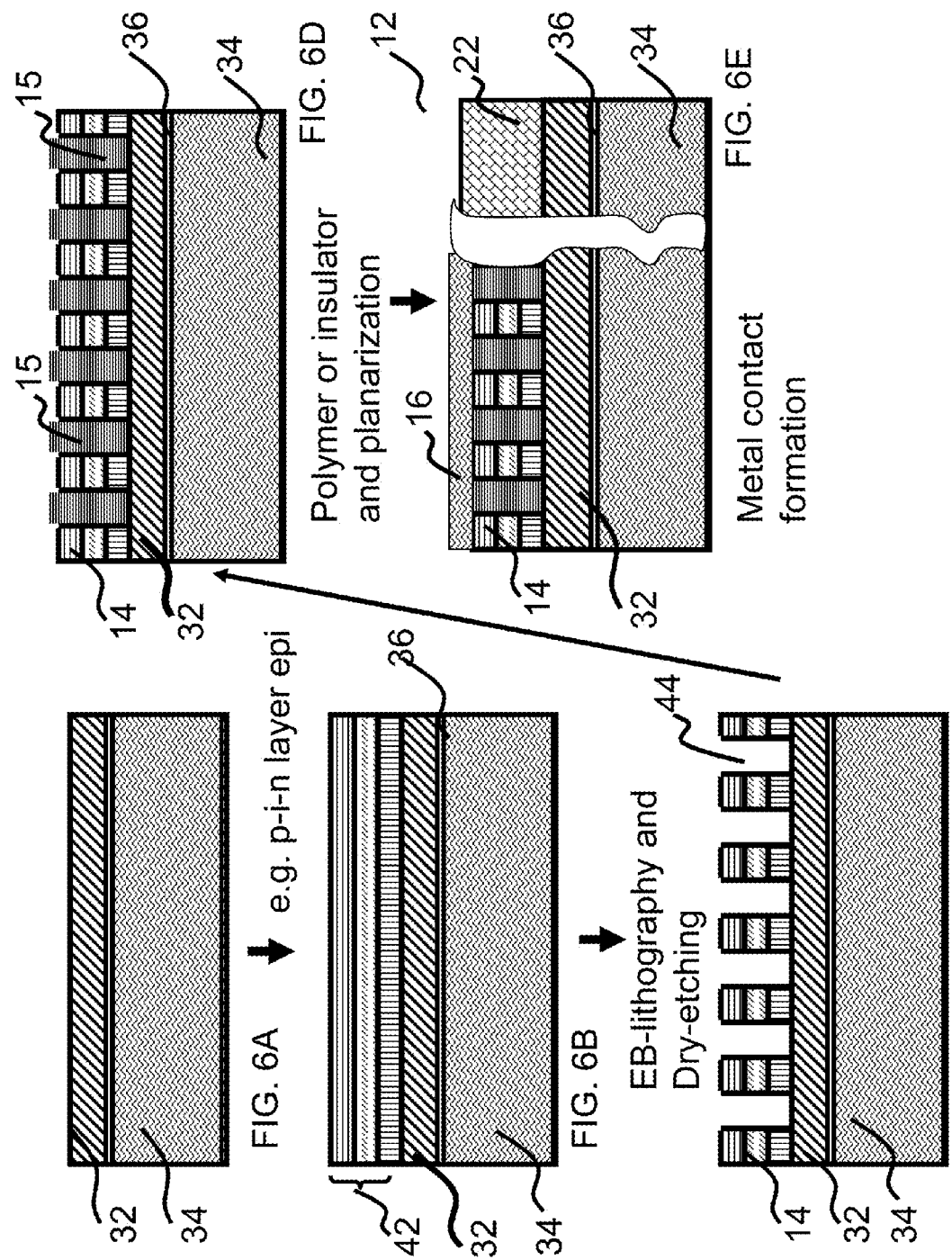
FIGS. 6A to 6E are the schematics showing the cross-sectional views of the fabrication process for sensor device in accordance to the present invention.
Figure 7:
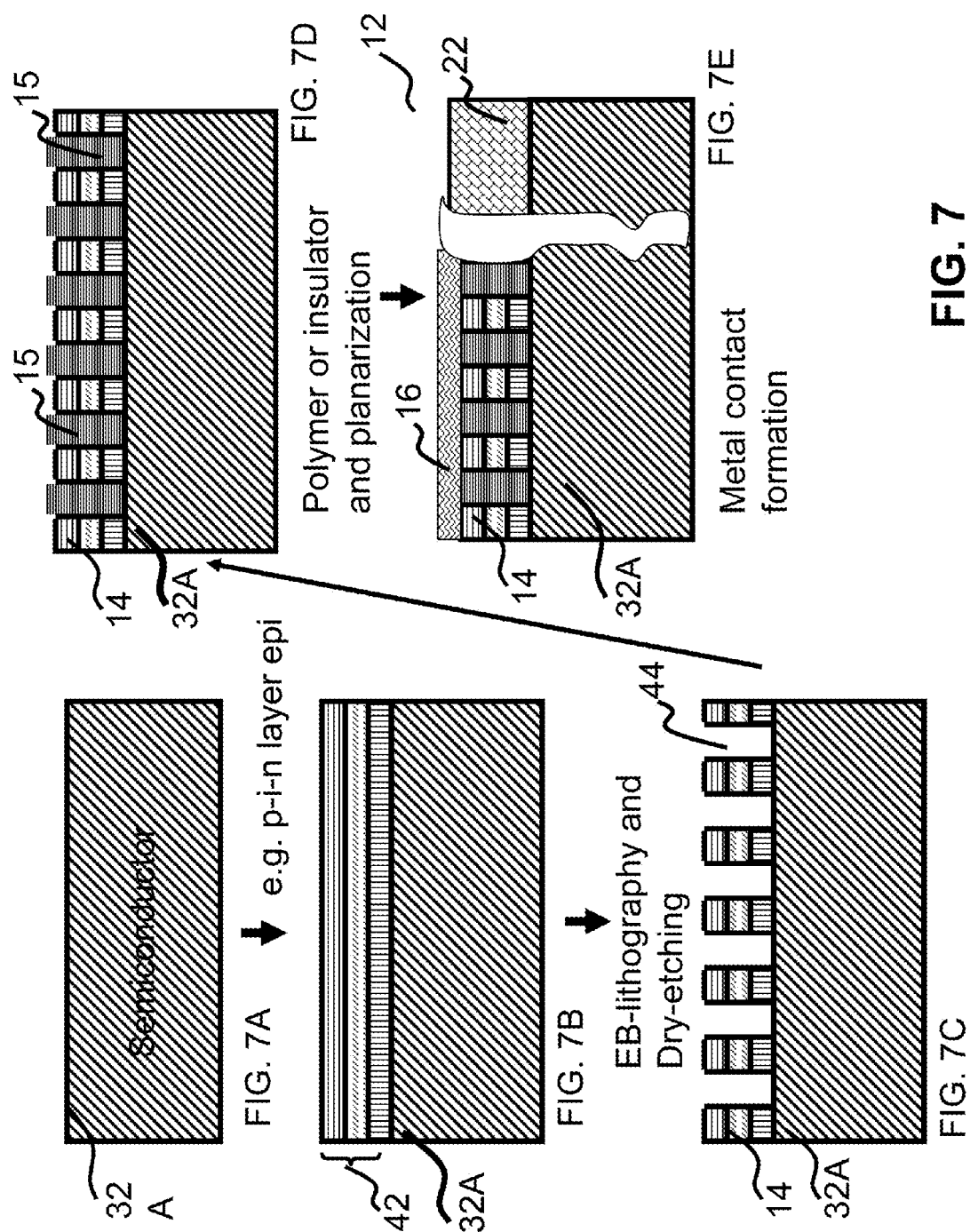
FIGS. 7A to 7E are the schematics showing the cross-sectional views of alternative fabrication process for sensor device, prior to transferring, in accordance to the present invention.
Figure 10A:
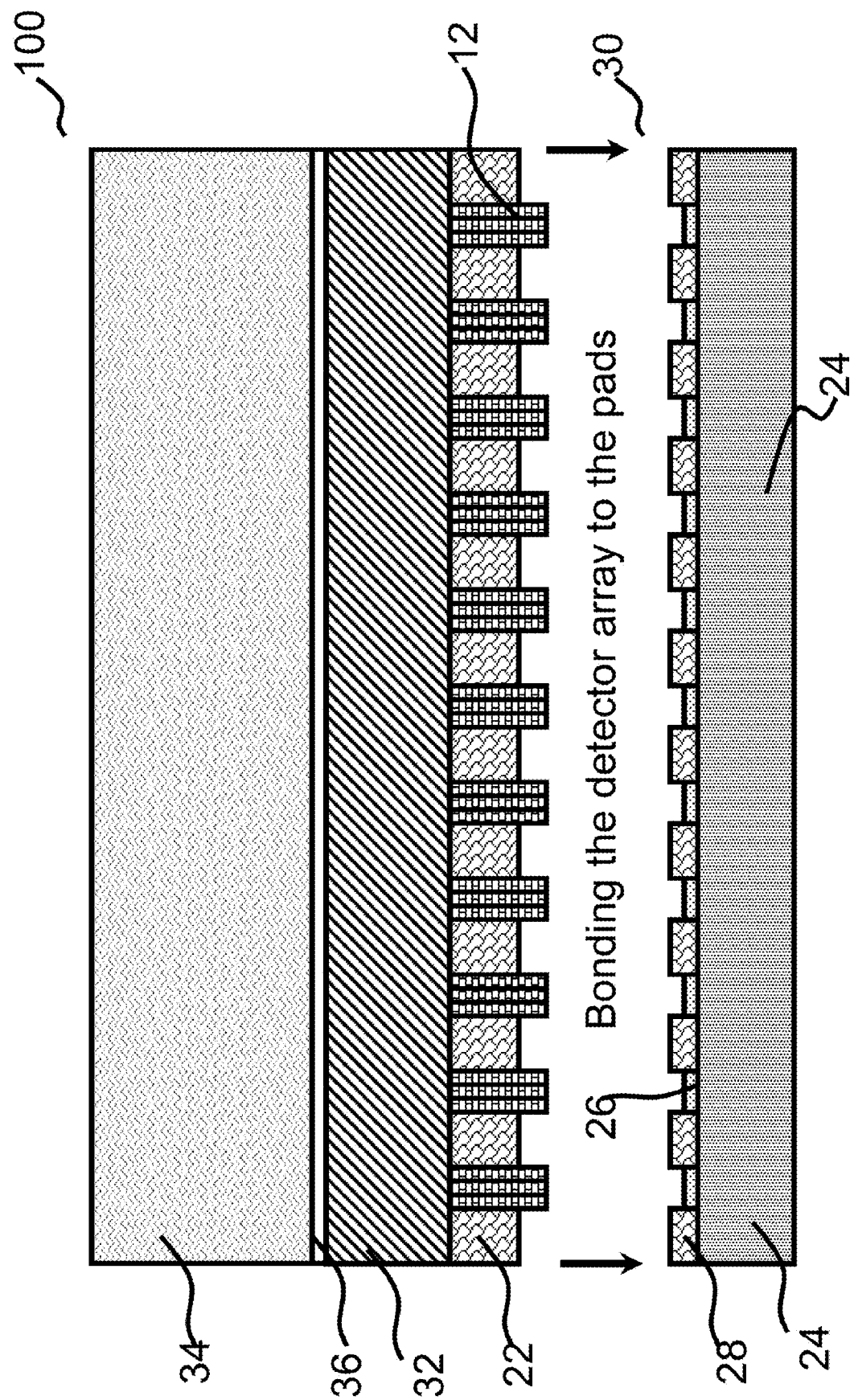
Figure 10B:
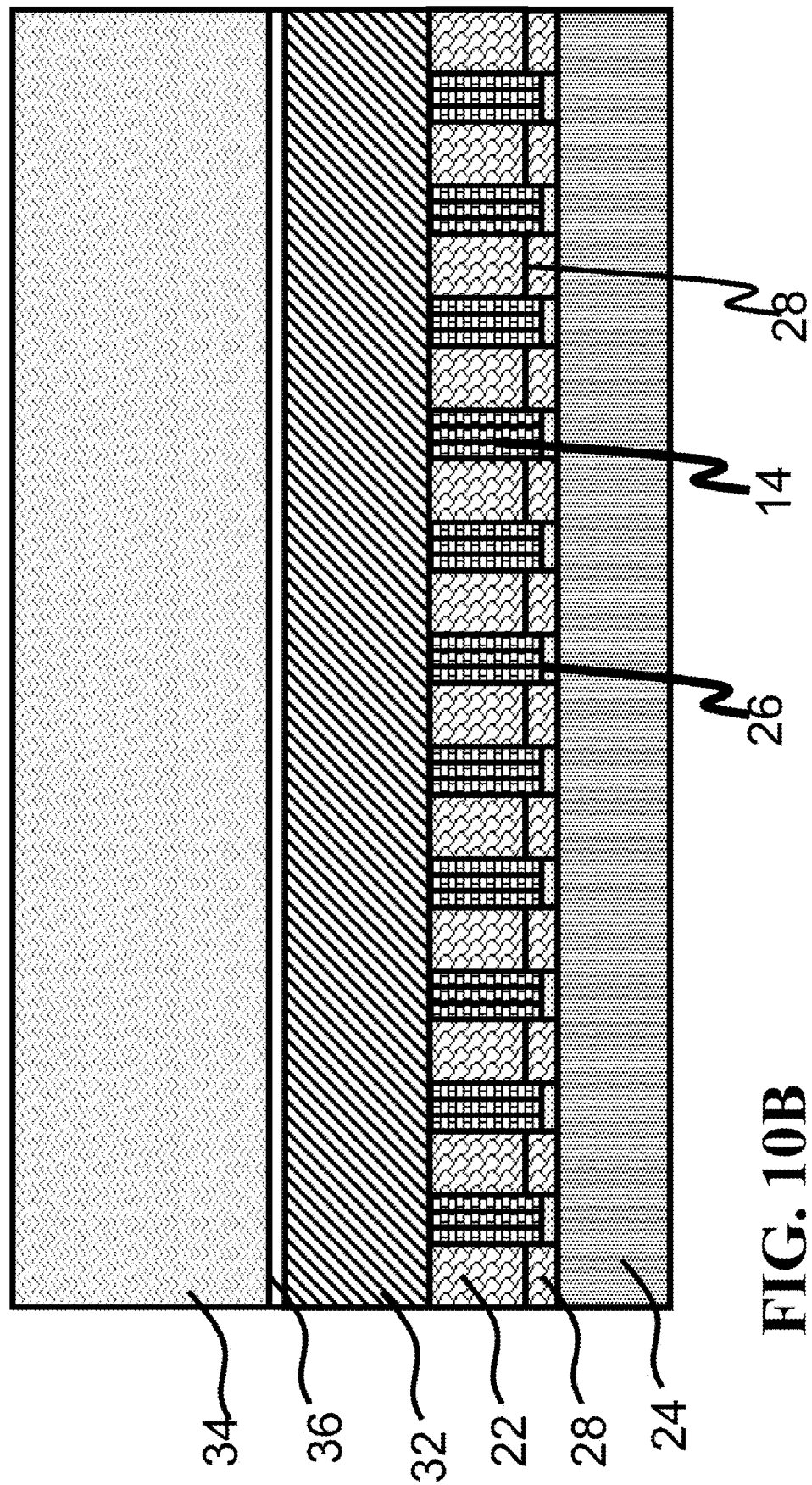

Alternatively, nano-pillar as the 3-D block 14 is used instead of the p-i-n structure based 3-D blocks, described in FIG. 6. In this case, p-n junction (not shown in FIG. 6) is made using either different type (p or n-type) material, grown following the pillar formation. In this case p-n junction is formed all over the surface of the pillar. Planarization and metallization process are the same as described in FIG. 6, so that repeated explanation is omitted here.

FIGS. 7A to 7E are the schematics showing alternative fabrication process of the sensor device prior to transferring, in accordance to the present invention wherein the same parts are represented by the same numerals as shown in FIGS. 2, 5, and 6, so that repeated explanation is omitted here. This fabrication process described here is only for an example, not for the limitation. Every material system can be used for making the detector element utilizing other material system. This fabrication process covers also other material systems such as GaN, Si, SiGe, GaAs, InP, InAs, HgCdTe, PbS, etc. The differences between FIG. 6 and FIG. 7 are that, thicker substrate can be used in FIG. 7, prior to the transferring. Other processes are the same as explained in FIG. 6, so that repeated explanation is omitted here.

FIGS. 8A and 8B are the schematics showing the cross-sectional view and the top views of the image sensor array prior to the transferring in accordance to this present invention, wherein the same parts are represented by the same numerals as shown in FIGS. 2, 5, 6, and 9, so that repeated explanation is omitted here. According to this invention, sensor array 100 is fabricated and made ready to transfer to the foreign substrate. As stated previously, each sensor pixel 12 comprises with multiple nano-scaled 3-D blocks 14 and the substrate or layer 34, either attached with the carrier substrate 32 by adhesive 36, or the substrate itself. Each sensor pixel 12 is separated by the insulator 22, having the height appropriate for easiness in transferring to the foreign substrate (not shown here).

FIGS. 9A and 9B are the schematics showing the cross-sectional view and the top views of the ROIC prior to the transferring in accordance to this present invention, wherein the same parts are represented by the same numerals as shown in FIG. 2, so that repeated explanation is omitted here. According to this invention, ROIC 30 is fabricated and made ready to transfer/bond to the image sensor substrate. As stated previously, each pad 26 is connected to the sensor pixel and each pixel can be independently operated. Each pad 26 is separated by the insulator 28, having the height appropriate for easiness in transferring to the foreign substrate (not shown here).

FIGS. 10A to 10E are the schematics showing the cross-sectional views of the process fabricating the multispectral image sensor and its ROIC, in accordance to this present invention, wherein the same parts are represented by the same numerals as shown in FIGS. 2, 5, 6, 7, 8, and 9, so that repeated explanation is omitted here. According to this invention, image sensor array 100 is bonded on to the ROIC 30. Each pixel 12 in image sensor array 100 is bonded with pad 26 of the ROIC 30. Bumps (not shown here) can be used in between the pixel and pads for bonding. Bump material can be selected from Au:Sn, In, Au:Ge, In:Au etc. materials. Image sensor array 100 can be transferred to the ROIC substrate using the IR imaging where each pixel at the size as small as submicron range can be adjusted in x, y and z direction. The insulator layers 22 and 28, located in image sensor array 100 and ROIC 30, respectively help to position the sensor pixel 12 right on to the pad 26. IR heating or UV heating makes the bonding of the image sensor array 100 and ROIC 30. After the bonding, the carrier substrate 34, if any is taken out and the thinner substrate or interface/buffer layer 32 is etched out completely or left little portion (not shown here). Dry-etching or wet etching technique can be used to etch out the layer 32. This is followed by the formation of the transparent metal contact 18, acting as the common metal contact for all sensor pixel.

According to this invention, conducting polymer with or without heat treatment requirement, can also be used to reduce the contact resistance and also to reduce the stress, experienced during the bonding process. For example, if z-axis polymer is used for bonding purpose, it can not only reduce the stress that is inserted/experienced during the bonding process, but also it helps to reduce the contact resistance in between pads and the pixel metallic contact 16.

According to this invention, carrier substrate is used with the thinner substrate, to make easiness in handling in the fabrication process. Thicker substrate can also be used, and bonding can be done before or after substrate etching out.

According to this invention, transparent conductive layer can be selected from the groups consisting of indium-tin-oxide, indium oxide, tin oxide, or NiCr layer. Any conductive polymer but transparent to the wavelengths of interest, can also be used.

According to this invention, ROIC 30 and image sensor array 100 are vertically bonded. They could be bonded to the other substrate, where in ROIC and image sensor are discretely bonded to the common substrate (not shown here). In this case, both image sensor and ROIC are bonded separately in different location.

Figure 11A:
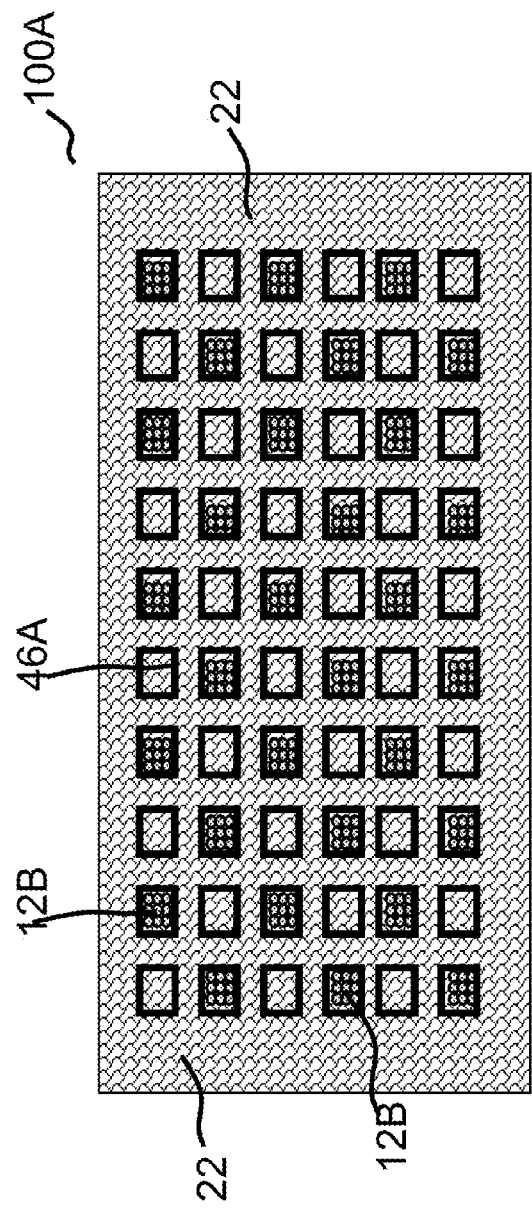
FIGS. 11A and 11B are the top views of the sensor arrays fabricated from two different material systems for covering different spectral bands.
Figure 11B:
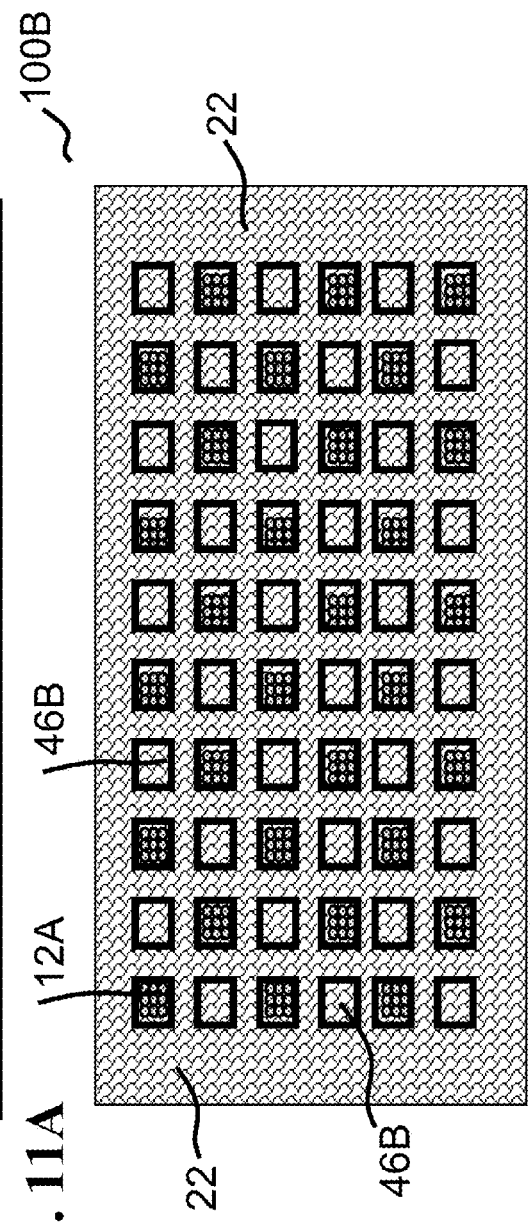
Figure 11C:
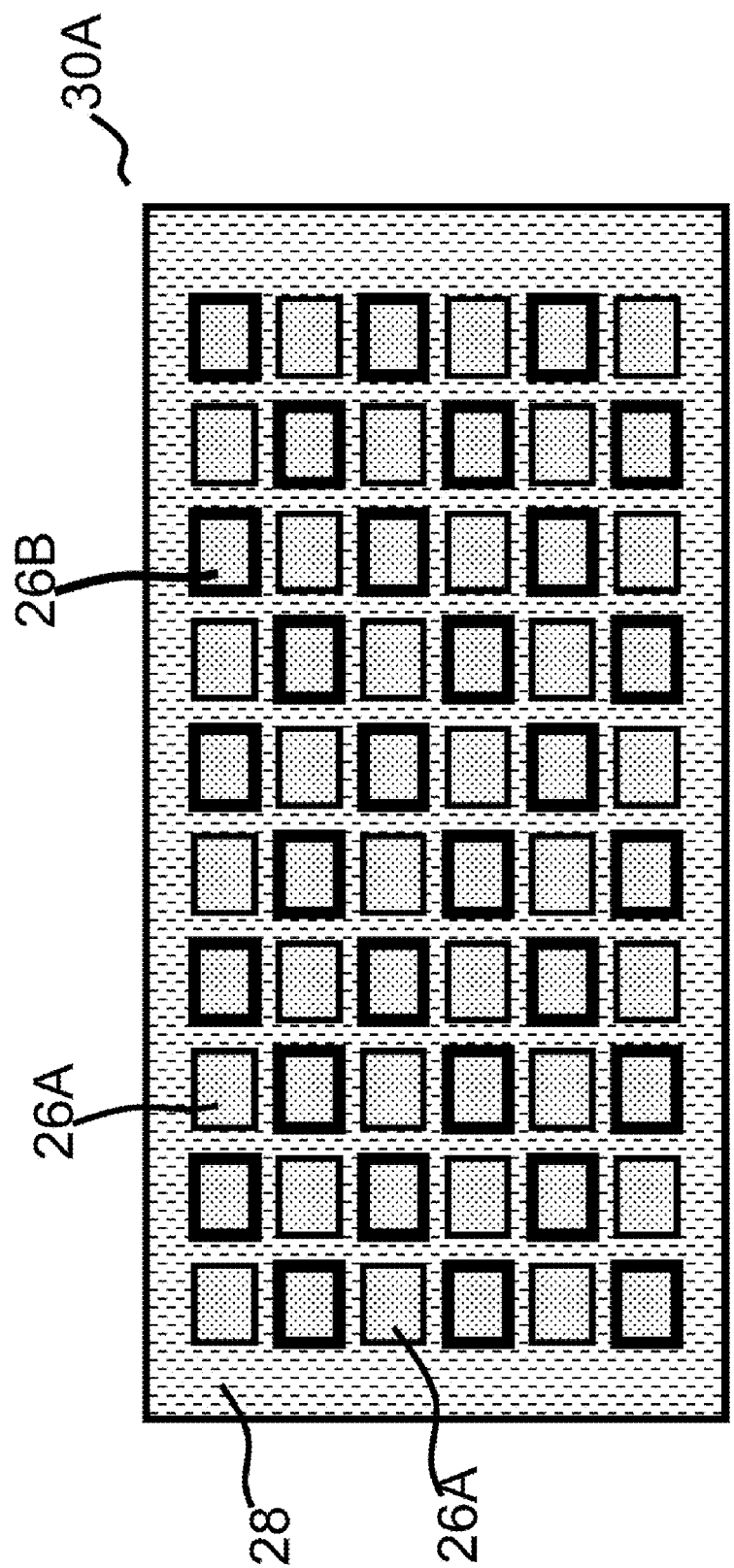
FIG. 11C is the top view of the ROIC for incorporating the two sensor arrays made from two different material systems, in accordance to this invention.

FIGS. 11A and 11B are the schematics showing the top views of the sensor arrays fabricated from two different material systems for covering different spectral bands, and FIG. 11C is the top view of the ROIC for incorporating the two sensor arrays made from two different material systems, in accordance to this invention, wherein like numerals represent similar parts as explained in FIGS. 2, 5, 6, 7, 8, 9, and 10, so that repeated explanation are omitted here. According to this invention, the image sensing device can be made to be broadened, from UV to long infrared as high as 20 µm or beyond than that (e.g. 30 µm). In this case several material systems requires to be used for covering each band and require transfer to the common substrate, in this case for example ROIC 30. In this case, image sensor devoice (including ROIC) can be designed in a way that, pixel from different material systems (e.g. 12A and 12B) detect the specific spectral band and they require to place in position in the ROIC 30A, alternatively side by side like 26A and 26B, as shown in FIG. 11C, to independently capture each band light and process separately by ROIC. For example, UV to short wave infrared wavelength is detected by sensor pixel 12A in image sensor array 100A, (FIG. 11A), and mid infrared wavelength is detected by pixel 14B (FIG. 11B), fabricated from different material systems. Space 46A and 46B are needed to keep empty in two image sensor arrays 100A and 100B. Those image sensor arrays 100A and 100B are transferred to the ROIC 30A, one after another, as explained previously. After transferring each image sensor array (100A and 100B), the transparent metal contacts are formed which acts as the common metal contact for all image sensor pixel.

According to this invention, the ROIC 30A, can process the signal separately or together, for each pixel 26A and also 26B, made from different material system, After signal processing, image can be either generated for each spectral band separately or together, as necessary base.

According to this invention, top electrode metal can be transparent over the wavelength of interest. Indium-tin-oxide can be used as the top-contact metal. If non-transparent metal is used as the metal contact 18, then thinner Ni:Cr is used as the contact metal. This can be followed by the metallization to make the ring shaped metal contact for bonding purpose.

In the preferred embodiment, top and bottom incident type photodiodes and their array are described. In the preferred embodiment, we have explained the fabrication process compatible for standard fabrication process. In the top-incident type photodiode array, the metal line can be fabricated to connect each photodiode element with the outside pad using of the nano imprint technology or molding. This would help to increase the photodiode surface wider and/or to increase the fill-factor of the array. Increasing the fill-factor and also increasing the number of the elements in the array would help to increase the detection resolution. In the case of bottom incident type photodiode array, individually operated pixel can be bonded and in this case metal line is not required to draw from the photodiode surface. This increases the resolution of detection.

In the preferred embodiment, an example using InGaAs layer as the absorption layer is explained for the purpose of an example to show the benefit of the invention, not limiting the invention. This can also utilized other material systems such as HgCdTe, CdTe, Cadmium gallium indium selenide (CIGS), Si, Si:Ge, Ge, GaAs, InAs, InP, InGaAs, or GaN based materials.

The present invention has been described above by way of its embodiments. However, those skilled in the art can reach various changes and modifications within the scope of the idea of the present invention. Therefore it is to be understood that those changes and modifications also belong to the range of this invention. For example, the present invention can be variously changed without departing from the gist of the invention, as indicated below.

According to the present invention, it is our object to have the photodiode structure, which could provide the broad spectral detection capability ranges from <300 nm to as high as 3500 nm and beyond, high quantum efficiency >95%, and high frequency response (e.g. >10 GHz frequency response at 3 dB for the photodiode size of below 5.mu.m).

According to the present invention, it is our also object to provide the photodiode array of N×N elements which could also provide the broad spectral detection capability ranges from <300 nm to as high as 10,000 and beyond, high quantum efficiency >85%, and high frequency response. Better frequency response can also be expected if the metal line is designed as the transmission line of coplanar line or microstrip line types.

It is also our object to have the image sensor structure, which can provide stable spectral detection performance under wide range of temperature variation. Unlike a wide-wavelength wafer bonded image sensor, this present invented sensor is capable of operating at any temperature with slight variation in the quantum efficiency for long wavelengths as the bandgap increases with decreasing temperature.

In the preferred embodiment, the photodiode array of N×N elements where each photodiode can be addressable independently is explained. Sensor arrays having broad spectral detection ranges can also have the structure where the photodiode elements are connected by the two-axis electrode.

The present invention is expected to find practical use in multiple purpose applications such as telecommunication, imaging (where CCD cannot be used), and also many sensing applications, and also in the applications including surveillance, satellite tracking, advanced radar systems, etc. The most important advantage of this photodiode is that the performance will not be degraded under wide range of temperature variation, which eliminates the use of the temperature controller. Other advantage of this invention is that conventional fabrication technology can be used to fabricate the single photodiode or its array herein described.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here as set forth.

What is claimed is:

1. A method of manufacturing an image sensor, comprising:
    depositing a detector structure on a substrate;
    patterning and etching said detector structure to form an array of pluralities of pillars,
        wherein a cross sectional area of each said pillar is less than 10 square micrometers;
    filling the array of spaces between said pillars with insulator;
    planarizing a surface opposite to said substrate;
    and bonding the array of the detector structures to a read out integrated circuit.

2. The method of manufacturing an image sensor of claim 1,
    wherein said substrate comprises a thin substrate attached to a carrier substrate, and said method further comprises removing said carrier substrate and attaching a common metal contact to said thin substrate.

3. The method of manufacturing an image sensor of claim 1, further comprising removing said substrate and attaching a common metal contact.

4. The method of manufacturing an image sensor of claim 1, wherein said detector structure is of a type selected from the group consisting of p-n type, p-i-n type, quantum-well type, quantum-dot type, and conducting type.

5. The method of manufacturing an image sensor of claim 1, wherein said insulator is selected from the group consisting of silicon oxide, silicon nitride, sol-gel silicon oxide, and polymer.

6. The method of manufacturing an image sensor of claim 1, comprising the step of attaching a metal contact to each said plurality of pillars prior to said bonding to a read out integrated circuit.

7. The method of manufacturing an image sensor of claim 1, wherein said patterning utilizes electron beam patterning or nano-imprinting with a master mold.

8. The method of manufacturing an image sensor of claim 1, wherein said etching comprises dry etching using standard resist or any mask material.

9. A method of manufacturing an image sensor, comprising:
- depositing an insulator on a substrate;
- patterning and etching said insulator to form an array of spaces;
- growing an array of detector structures in said array of spaces;
- etching said array of detector structures to form an array of pluralities of pillars,
    - wherein a cross sectional area of each said pillar is less than 10 square micrometers;
- filling the array of spaces between said pillars with insulator;
- planarizing a surface opposite to said substrate;
- and bonding the array of the detector structures to a read out integrated circuit.

10. The method of manufacturing an image sensor of claim 9, wherein said substrate comprises a thin substrate attached to a carrier substrate, and said method further comprises removing said carrier substrate and attaching a common metal contact to said thin substrate.

11. The method of manufacturing an image sensor of claim 9, further comprising removing said substrate and attaching a common metal contact.

12. The method of manufacturing an image sensor of claim 9, wherein said detector structures are of a type selected from the group consisting of p-n type, p-i-n type, quantum-well type, quantum-dot type, and conducting type.

13. The method of manufacturing an image sensor of claim 9, wherein said insulator is selected from the group consisting of silicon oxide, silicon nitride, sol-gel silicon oxide, and polymer.

14. The method of manufacturing an image sensor of claim 9, comprising the step of attaching a metal contact to each said plurality of pillars prior to said bonding to a read out integrated circuit.

15. A method of manufacturing an image sensor, comprising:
- depositing an insulator on a substrate;
- patterning and etching said insulator to form an array of spaces;
- growing an array of pluralities of pillars in said array of spaces,
    - wherein said pillars are detector structures,
    - and wherein a cross sectional area of each said pillar is less than 10 square micrometers;
- filling the array of spaces between said pillars with insulator;
- planarizing a surface opposite to said substrate;
- and bonding the array of the detector structures to a read out integrated circuit.

16. The method of manufacturing an image sensor of claim 15, wherein said substrate comprises a thin substrate attached to a carrier substrate, and said method further comprises removing said carrier substrate and attaching a common metal contact to said thin substrate.

17. The method of manufacturing an image sensor of claim 15, further comprising removing said substrate and attaching a common metal contact.

18. The method of manufacturing an image sensor of claim 15, wherein said detector structures are of a type selected from the group consisting of p-n type, p-i-n type, quantum-well type, quantum-dot type, and conducting type.

19. The method of manufacturing an image sensor of claim 15, wherein said insulator is selected from the group consisting of silicon oxide, silicon nitride, sol-gel silicon oxide, and polymer.

20. The method of manufacturing an image sensor of claim 15, comprising attaching a metal contact to each said plurality of pillars prior to said bonding to a read out integrated circuit.

* * * * *